(12) United States Patent
Wang

(10) Patent No.: US 9,952,297 B2
(45) Date of Patent: Apr. 24, 2018

(54) PARALLEL PLATE TRANSMISSION LINE FOR BROADBAND NUCLEAR MAGNETIC RESONANCE IMAGING

(71) Applicant: AUBURN UNIVERSITY, Auburn, AL (US)

(72) Inventor: Shumin Wang, Auburn, AL (US)

(73) Assignee: AUBURN UNIVERSITY, Auburn, AL (US)

(*) Notice: Subject to any disclaimer, the term of this patent is extended or adjusted under 35 U.S.C. 154(b) by 382 days.

(21) Appl. No.: 14/706,143

(22) Filed: May 7, 2015

(65) Prior Publication Data

US 2015/0323622 A1 Nov. 12, 2015

Related U.S. Application Data

(60) Provisional application No. 61/990,234, filed on May 8, 2014.

(51) Int. Cl.
| | |
|---|---|
| *G01V 3/00* | (2006.01) |
| *G01R 33/345* | (2006.01) |
| *G01R 33/34* | (2006.01) |
| *G01R 33/36* | (2006.01) |
| *G01R 33/48* | (2006.01) |

(52) U.S. Cl.
CPC ..... *G01R 33/345* (2013.01); *G01R 33/34092* (2013.01); *G01R 33/3635* (2013.01); *G01R 33/3657* (2013.01); *G01R 33/3678* (2013.01); *G01R 33/4802* (2013.01)

(58) Field of Classification Search
CPC ............ G01R 33/345; G01R 33/34092; G01R 33/3635; G01R 33/3678; G01R 33/3657; G01R 33/4802

USPC ................................................ 324/318, 322
See application file for complete search history.

(56) References Cited

U.S. PATENT DOCUMENTS

| | | | |
|---|---|---|---|
| 2,290,314 A | 7/1942 | Carter | |
| 4,554,553 A * | 11/1985 | Grim | H01P 1/165 324/95 |
| 5,705,962 A * | 1/1998 | Fleeger | H01P 5/16 333/125 |
| 7,541,135 B2 * | 6/2009 | Swain | H01R 12/716 430/290 |
| 7,710,117 B2 * | 5/2010 | Vaughan | G01R 33/3415 324/318 |

(Continued)

OTHER PUBLICATIONS

Brunner et al.; "Travelling-Wave Nuclear Magnetic Resonance"; Nature 2009; vol. 457, pp. 994-998.

(Continued)

*Primary Examiner* — Farhana Hoque
(74) *Attorney, Agent, or Firm* — Gardner Groff Greenwald & Villanueva, PC

(57) ABSTRACT

A parallel plate waveguide forms a volume coil used for magnetic resonance imaging and spectroscopy. The waveguide includes a first conductor arranged on a first side of the waveguide and a second conductor arranged on a second side of the waveguide. Excitation of the first conductor and the second conductor creates a transverse electromagnetic field between the first conductor and the second conductor which causes a target within the volume coil to emit radio frequency signals used for producing an image of the target.

18 Claims, 26 Drawing Sheets

(56) References Cited

U.S. PATENT DOCUMENTS

| | | | | |
|---|---|---|---|---|
| 2005/0211889 A1* | 9/2005 | Varchena | ............ | A61N 5/1048 250/252.1 |
| 2008/0265999 A1* | 10/2008 | Wan | ........................ | H03L 7/07 331/16 |
| 2009/0026964 A1* | 1/2009 | Knaus | ............... | H01J 37/32045 315/111.21 |
| 2010/0117642 A1* | 5/2010 | Zhai | ................. | G01R 33/34046 324/307 |
| 2010/0213941 A1* | 8/2010 | Driesel | ............. | G01R 33/3415 324/322 |
| 2011/0291655 A1* | 12/2011 | Hamamura | ........ | G01R 33/3642 324/318 |
| 2012/0256639 A1* | 10/2012 | Pausini | ............ | G01R 31/31709 324/613 |
| 2014/0021963 A1* | 1/2014 | Cole | ...................... | G01R 31/11 324/537 |

OTHER PUBLICATIONS

Hayes et al.; An Efficient, Highly Homogeneous Radiofrequency Coil for Whole-Body NMR Imaging at 1.5 T; Journal of Magnetic Resonance; 1985; vol. 63; pp. 622-628.

Zheng et al.; Broadband Phase Shifter Using Loaded Transmission Line; IEEE Microwave and Wireless Components Letters; vol. 2010, No. 9; pp. 498-500.

Lu et al. "Parallel-Plate Waveguide for Volume Radio Frequency Transmission in MRI", Magnetic Resonance, Nov. 13, 2014.

Majid et al. "A Capacitive Sensor Interface Circuit Based on Phase Differential Method", World Academy of Science, Engineering and Technology, 2009.

Vaughan et al. "Detunable Transverse Electromagnetic (TEM) Volume Coil for High-Field NMR", Magnetic Resonance, 2002.

McIntosh et al. "Fringing Field Capacitance Sensor for Measuring the Moisture Content of Agricultural Commodities", IEEE Sensors Journal, 2008.

Muftuler et al. "Automatic Tuned MRI RF Coil for Multinuclear Imaging of Small Animals at 3T", Journal of Magnetic Resonance, 2002.

Alejo et al. "Automatic Tuning and Matching of a Small Multifrequency Saddle Coil at 4.7 T", Magnetic Resonance, 2004.

Wang et al. "Full-Wave Evaluations of Loading Factors of Small Animal RF Receive Coils", Proc. Intl. Soc. Mag. Reson. Med. 15, 2007.

Sohn et al. "Electrically auto-tuned RF coil design", Proc. Intl. Soc. Mag. Reson. Med. 19, 2011.

Brunner et al. "Travelling-wave nuclear magnetic resonance", Nature, 2009.

Webb et al. "MRI and Localized Proton Spectroscopy in Human Leg Muscle at 7 Tesla Using Longitudinal Traveling Waves", Magnetic Resonance, 2010.

Andreychenko et al. "Improved RF Performance of Travelling Wave MR with a High Permittivity Dielectric Lining of the Bore", Magnetic Resonance, 2013.

Zhang et al. "Whole Body Traveling Wave Magnetic Resonance Imaging at High Field Strength: Homogeneity, Efficiency, and Energy Deposition as Compared With Traditional Excitation Mechanisms", Magnetic Resonance, 2012.

Tang et al. "Cutoff-Free Traveling Wave NMR", Concepts Magn Reson Part A, 2011.

Zhang et al. "Studies on MR Reception Efficiency and SNR of Non-resonance RF Method (NORM)", Proc. Intl. Soc. Mag. Reson. Med. 17, 2009.

Bord et al. "Influence of the electrodes configuration on a differential capacitive rain sensor performances", Elsevier, Senors and Actuators, 2006.

Bruce et al. "Horizontal Rhombic Antennas", Proc. I. R. E., 1935.

Vazquez et al. "Travelling wave magnetic resonance imaging at 3 T", Journal of Applied Physics, 2013.

Chen et al. "Design and Implementation of Capacitive Proximity Sensor Using Microelectromechanical Systems Technology", IEEE Transactions on Industrial Electronics, 1998.

Sample et al. "A Capacitive Touch Interface for Passive RFID Tags", IEEE Internation Conference, 2009.

Dewarrat et al. "Measurement and Simulation of Conductive Dielectric Two-layer Materials with a Multiple Electrodes Sensor", IEEE, 2008.

Davis et al. "Radio Frequency and Circuit Design: Chapter Five—Filter Design and Approximation", John Wiley & Sons, Inc., 2001.

Dib et al. "Design and Optimization of Multi-Band Wilkinson Power Divider", Wiley Periodicals, Inc., 2007.

Isono et al. "Surface Micromachinable Accelerometer Using Fringe Electrical Field of Penetrating Ferroelectric Substrate and its Characterization", Transducers & Eurosensors, 2007.

Dean et al. "A Capacitive Fringing Field Sensor Design for Moisture Measurement Based on Printed Circuit Board Technology", IEEE Transactions on Instrumentation, 2012.

Christ et al. "The Virtual Family—development of surface-based anatomical models of two adults and two children for dosimetric simulations", IOP Publishing, Phys. Med. Biol. 55, 2010.

Gedney, "A Study of the Parallel-Plate EMP Simulator and the Simulator-Obstacle Interaction", USACERL Technical Report, 1990.

Zheng et al. "Broadband Phase Shifter Using Loaded Transmission Line", IEEE Microwave and Wireless Components Letters, vol. 20, No. 9, 2010.

Yeo et al. "Local Specific Absorption Rate in High-Pass Birdcage and Transverse Electromagnetic Body Coils for Multiple Human Body Models in Clinical Landmark Positions at 3T", Journal of Magnetic Resonance Imaging 33:1209-1217, 2011.

Collins et al. "Calculations of B1 Distribution, SNR, and SAR for a Surface Coil Adjacent to an Anatomically-Accurate Human Body Model", Magnetic Resonance, 2001.

Gabriel. "Compilation of the Dielectric Properties of Body Tissues at RF and Microwave Frequencies", Occupational and Environmental Health Directorate, 1996.

Schiffman. "A New Class of Broad-Band Microwave 90-Degree Phase Shifters", IRE Transactions on Microwave Theory, 1958.

Vaughn, "RF Coils for MRI", John Wiley & Sons, 2012. <https://books.google.com/books?id=RHGX79V2jVgC&printsec=frontcover&dq=Griffiths,+John+R.&num=4&client=internal-uds&cd=3&source=uds#v=onepage&q=Griffiths%2C%20John%20R.&f=false>.

* cited by examiner

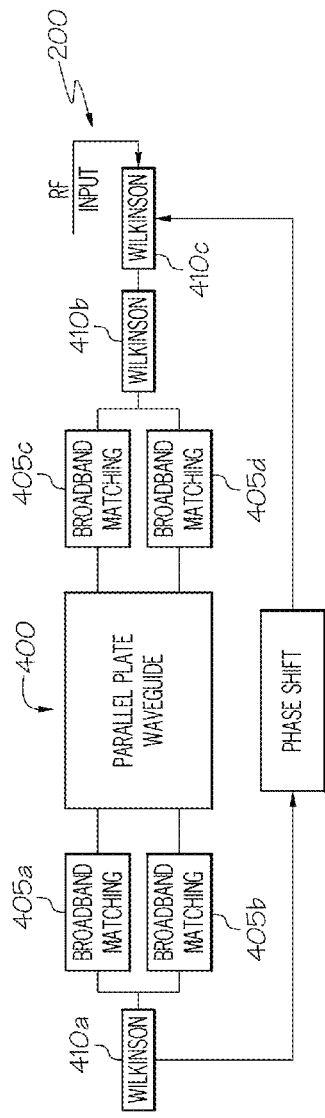
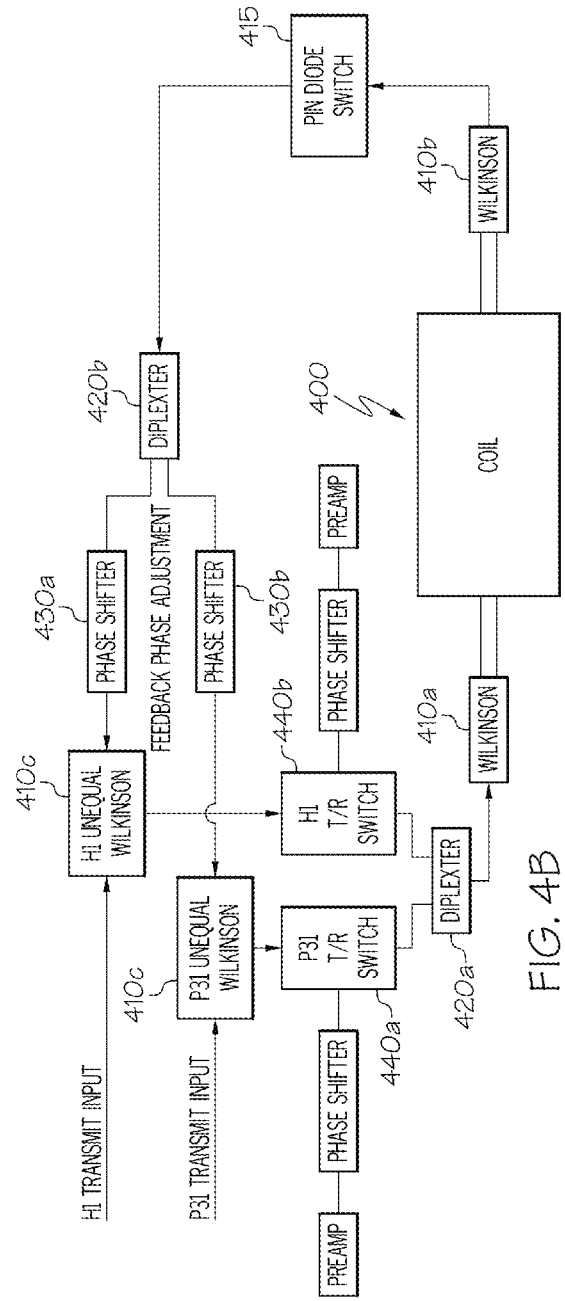
FIG. 4A
FIG. 4B

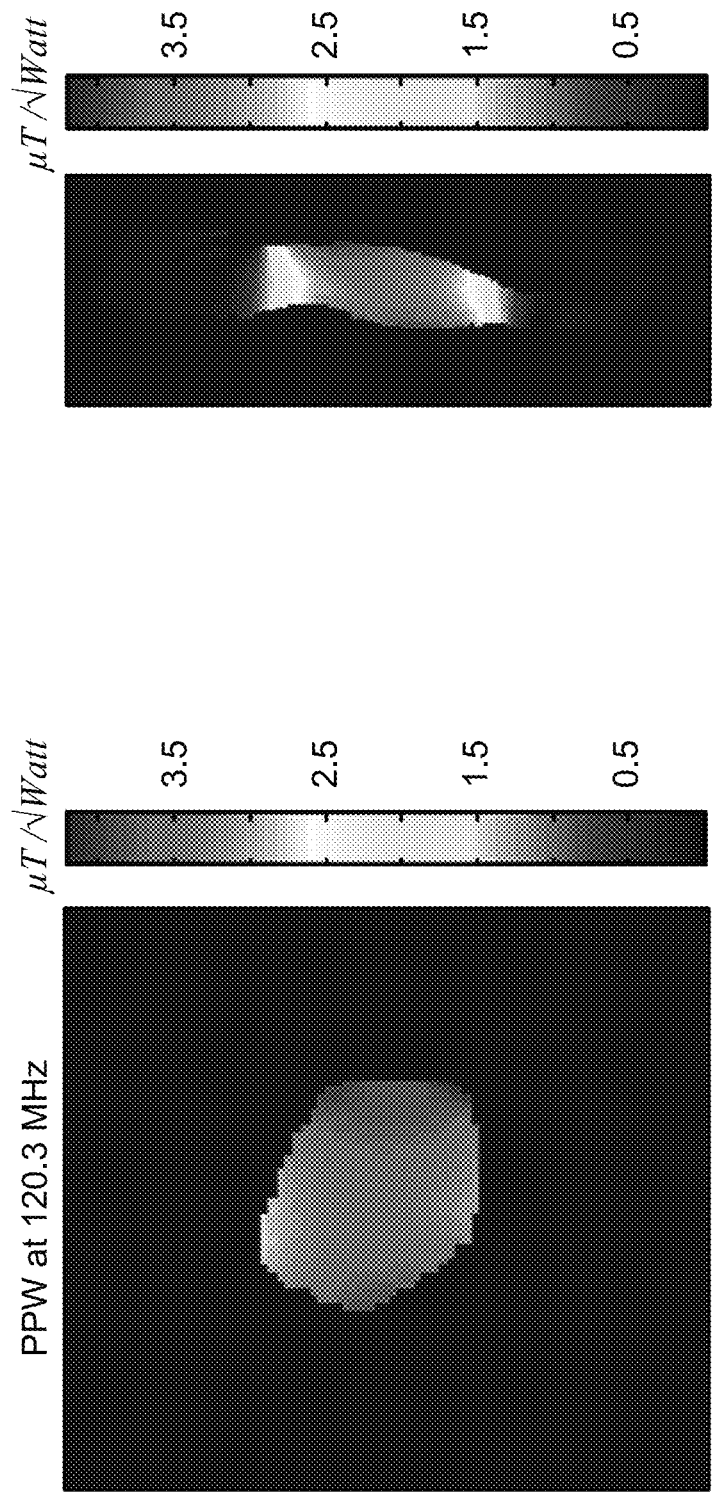

PARALLEL PLATE TRANSMISSION LINE FOR BROADBAND NUCLEAR MAGNETIC RESONANCE IMAGING

CROSS-REFERENCE TO RELATED APPLICATIONS

This application claims the benefit of U.S. Provisional Patent Application Ser. No. 61/990,234, filed May 8, 2014, the entirety of which is hereby incorporated herein by reference in their entireties for all purposes.

TECHNICAL FIELD

This invention relates generally to the field of magnetic resonance imaging; and more particularly to a device for broadband nuclear magnetic resonance imaging using a parallel plate transmission line.

BACKGROUND

Magnetic Resonance Imaging (MRI) scanning has grown into a major diagnostic tool, with MRI instrumentation technology becoming a multi-billion dollar global industry. MRI scanners use magnetic fields and radio waves to form images of the body. To perform an MRI scan, a patient or a body part to be scanned is placed inside a radio frequency (RF) volume coil. The MRI scanner forms a strong magnetic field around the area to be imaged by passing an electric current through the wire loops. While this is happening, other coils in the magnet send and receive radio waves. This triggers protons in the body to align themselves. Once aligned, radio waves are absorbed by the protons, which stimulate spinning. Energy is released after "exciting" the molecules, which in turn emits energy signals that are received by the coil. The received signals are sent to a computer which processes the signals and generates an image. The final product is a 3-D image representation of the area being scanned.

Conventional RF coils, such as loops, birdcage coils, and transverse electromagnetic (TEM) coils are resonant structures tuned to specific Larmor frequencies. By using reactive components to tune a coil to the designated mode, the coil current distribution produces a desirable magnetic field for imaging or spectroscopic applications.

Conventional resonant coils have a limited bandwidth, i.e., the desired coil current distribution appears in the close vicinity of the resonant frequency. Outside a certain frequency range, RF power input is reflected back to the generator due to impedance mismatch. This narrowband feature is typically characterized by the quality factor (Q-factor). A high Q-factor is generally appreciated as an indication of low coil/sample loss. Thus, on the one hand, high-Q coils are preferred for their low coil/sample losses. At the same time, the high Q-factor also indicates the sensitivity of the RF coil to its operating conditions. For high-Q coils, the resonant peak may shift with different loadings, e.g., different phantoms and/or settings inside the scanner bore. This problem is especially pronounced in high-field applications, where the design of transmit coils can be an especially challenging task. For multi-nuclear spectroscopic studies, these issues are aggravated because the design of dual-tuned volume coils is more complex than putting two single-tuned volume coils together.

From the electromagnetic perspective, high-Q resonators are sufficient but not necessary for effective, low-loss transmission. Taking resonant loops as an example, they support a standing-wave current distribution which is the superposition of two currents traveling in opposite directions. If the in-phase superposition of the two traveling currents can result in a low loss, so does each of its components.

The use of traveling-wave structures, which are non-resonant, instead of standing-wave structures has been extensively studied. Many broadband antennas are actually transmission lines that can support traveling waves. Due to the lack of sharp resonant peaks, a broadband antenna requires no specific frequency tuning within its operating bandwidth and is more robust and less sensitive to environmental changes and manufacturing defects.

The use of traveling-wave structures in MRI has also been studied by different groups. It has been demonstrated that is feasible to use the RF shield of an MRI scanner as a waveguide to support traveling waves. The main waveguide structure does not require reactive components for tuning, and a circularly polarized patch antenna was applied for RF excitation and signal reception. This concept has been further extended by using dielectric inserts to reduce impedance mismatch between air/tissue boundaries. A thorough comparison of this waveguide transmitter and the TEM coil has been performed using numerical simulations, and the investigation found that wave attenuation and reflection from body boundaries cause by substantial $B_1^+$ inhomogeneity, although a high degree of uniformity was achieved inside an empty scanner bore.

One of the main problems of waveguide-based RF transmitters is the existence of a cutoff frequency for the desired waveguide mode. The scanner bore needs to be large enough so that the cutoff frequency of the desired mode is below the Larmor frequency. Otherwise, electromagnetic waves are evanescent, not traveling. Because the bore size or regular human scanners is barely large enough to support ravels waves at 7T, this type of structure is not suitable for clinical MRIs.

In one approach, the transverse electromagnetic (TEM) mode of a coaxial cable was applied to in order to avoid the cutoff frequency issue. However, the requirement of a center conductor makes this approach difficult for human imaging.

In another approach, a surface transmitter was developed that utilizes the TEM mode supported by two closely spaced parallel conductors. A volume transmitter was later developed for parallel transmission by using an array of such surface transmitters or coils.

Current coils are expensive to manufacture, and also require tuning at very specific and discrete frequencies. Such tuning is expensive, time-consuming to implement, and often limits the applicability of a coil to a specific field strength.

SUMMARY

According to an illustrative embodiment, an imaging device includes a waveguide forming a volume coil. The waveguide includes a first conductor and a second conductor. The first conductor is arranged on a first side of the waveguide. The second conductor is arranged on a second side of the waveguide such that excitation of the first conductor and the second conductor creates a transverse electromagnetic field between the first conductor and the second conductor which causes a target within the volume coil to emit radio frequency signals used for producing an image of the target.

According to another embodiment, an imaging device includes a first waveguide and a second waveguide forming a volume coil. A first conductor is arranged on a first side of the first waveguide. A second conductor is arranged on a second side of the first waveguide such that excitation of the first conductor and the second conductor creates a transverse electromagnetic field between the first conductor and the second conductors. A third conductor is arranged on a first side of the second waveguide. A fourth conductor is arranged on a second side of the second waveguide, such that excitation of the third conductor and the fourth conductor creates a transverse electromagnetic field between the third conductor and the fourth conductor. The first conductor, the second conductor, the third conductor, and the fourth conductor are driven in quadrature for circular excitation that creates the transverse electromagnetic fields to cause a target within the volume coil to emit radio frequency signals used for producing an image of the target.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are explanatory of example embodiments of the invention, and are not restrictive of the invention, as claimed.

BRIEF DESCRIPTION OF THE DRAWINGS

FIG. 4a illustrates a simplified schematic of a parallel plate waveguide transmit coil according to an aspect.

FIG. 4b illustrates a detailed schematic of a parallel plate waveguide transmit coil according to another aspect.

FIGS. 6a and 6b illustrate the $B1^+$ field of a parallel-plate waveguide at 120.3 MHz.

DETAILED DESCRIPTION

The present invention may be understood more readily by reference to the following detailed description taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

According to an illustrative embodiment, an open parallel-plate waveguide is used for broadband RF excitation in a MRI device. A parallel-plate waveguide is an open transmission line that includes of two conductors with appropriate terminations that match its wave impedance. Just like a coaxial cable, the wave impedance of a parallel-plate waveguide is frequency-independent.

Open transmission lines have long been used as broadband antennas due to their simplicity and effectiveness. According to illustrative embodiments, the advantages of open transmission lines as broadband antennas can be retained in MRI applications with the use of broadband matching techniques. These advantages include simplicity of construction. The parallel plate waveguide can be constructed by using two copper foils without any reactive components for tuning. A transmitter as simple and compact as two actively driven parallel conducting plates can provide broadband RF excitations.

Another advantages of a parallel plate waveguide is that it is self-shielding. It does not require any additional RF shield to isolate the coil from the surrounding environment.

Another advantage of a parallel plate waveguide is that it allows for a broad bandwidth. It can be applied to multinuclear studies without needing to retune the coil.

Figure 1:
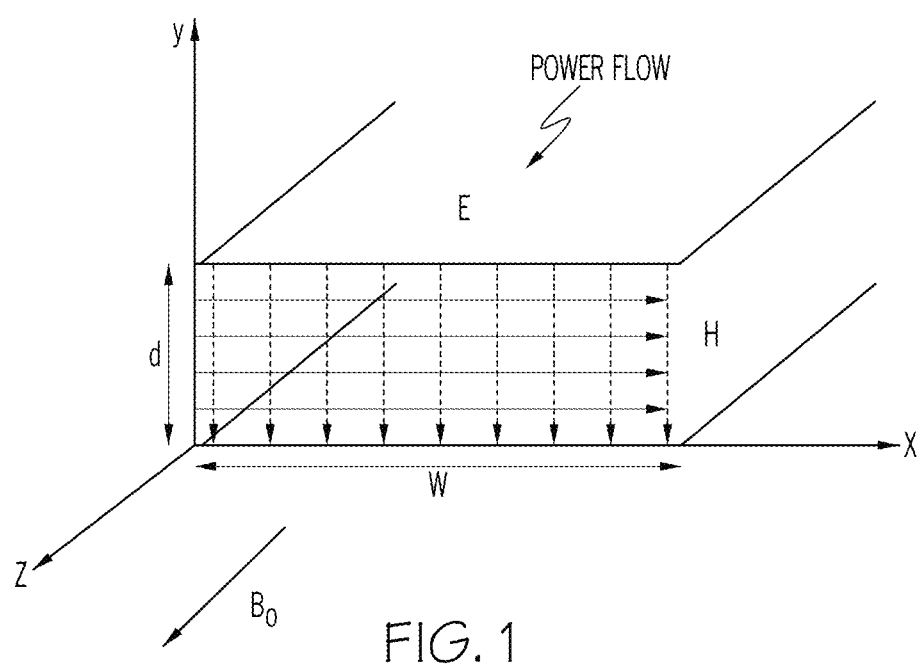
FIG. 1 illustrates the electromagnetic field distribution of the TEM mode of a parallel-plate waveguide.

The electromagnetic field distribution between two parallel plates can be expanded as a combination of different modes, which are not necessarily uniform except for the transverse electromagnetic (TEM) mode, as shown in FIG. 1. Referring to FIG. 1, in the TEM mode, the electric field E and the magnetic field H are transverse to the direction of propagation of power flow and the static magnetic flux density $B_o$.

To be useful in MRI, non-TEM (or higher-order) modes, such as transverse electric (TE) modes and transverse magnetic (TM) modes, need to be suppressed. According to electromagnetic theory, higher-order modes can be categorized as $TE_n^z$ and $TM_n^z$ modes, where superscript z represents the wave propagation direction and subscript n is the mode index.

For $TE_n^z$ modes, there exists a non-zero magnetic field component:

$$H_x = (j\omega\varepsilon/k_c)A_n\cos\left(\frac{n\pi y}{d}\right)e^{-j\beta z} \quad (1)$$

where $A_n$ is the mode amplitude, d is the distance between the two plates, $\beta=\omega\sqrt{\mu\varepsilon}$ is the angular wavenumber, and $k_c=n\pi/d$ is the cutoff wavenumber. According to Ampere's law, currents flowing on the two plates are in the same direction (in a common mode) when n is odd. For an even number of n, currents flowing on the two plates are in opposite directions, or in a differential mode.

For $TM_n^z$ modes, there exists a non-zero electric field component:

$$E_x = (j\omega\mu/k_c)B_n\sin\left(\frac{n\pi y}{d}\right)e^{-j\beta z} \quad (2)$$

where $B_n$ is the mode amplitude. A virtual ground is formed in the middle of the waveguide formed by the two plates only if n is even, which corresponds to differential modes. Thus, both $TE_n^z$ and $TM_n^z$ are differential when n is even. Because the TEM mode is differential and excited by connecting the signal and the ground on opposite plates, in theory only the differential modes can be excited when the TEM mode is intended. In practice, well-balanced feeding structures are preferred in order to suppress the common modes. The suppression of higher-order differential modes can be facilitated by impedance mismatching.

For the TEM mode, the frequency-independent wave impedance is:

$$Z_{TEM} = \eta\frac{d}{w} \quad (3)$$

where $\eta=\sqrt{\mu/\varepsilon}$ is the characteristic impedance between the parallel plates and w is the width of each the plates.

For the $TM_n^z$ mode, the wave impedance is:

$$Z_{TM} = \eta\sqrt{1-\left(\frac{k_c}{k}\right)^2} \quad (4)$$

For $TE_n^z$ modes, the wave impedance is:

$$Z_{TE} = \frac{\eta}{\sqrt{1-\left(\frac{k_c}{k}\right)^2}} \quad (5)$$

In both cases, the wave impedances are frequency-dependent. Both approach to $\eta$ when the frequency is infinitely high. Therefore, if the distance-to-width ratio is close to 1 or unity, the wave impedances of the differential $TM_n^z$ and $TE_n^z$ modes will be largely different from that of the TEM mode. For an impedance matching network designed to match cable impedance to that of the TEM mode, higher-order modes are rejected due to impedance mismatch.

Equation (3) further indicates that the TEM mode is broadband in nature since it does not have a size-related cut-off or resonant frequency. Its impedance is determined by the dielectric property of the medium between the plates and the distance-to-width ratio, not the actual size. Thus the effect of loading to the wave impedance can be approximated by using an effective permittivity. Since the human body does not have a regular shape, numerical simulations can be used for more accurate prediction of the wave impedance.

A tapered conical transmission line can be used to connect a parallel-plate waveguide to a regular transmission line, e.g., a co-axial cable. However, its straightforward implementation will block the access of patients to the interior of the waveguide. That is, it would not enable patient access unless the longitudinal axis (represented as the z-direction in FIG. 1) is transverse to $B_0$ field, which results in a $B_1^+$ distribution that is not of much use in MRI.

To this end, according to an illustrative embodiment, a tapered conical transmission line is split into two halves. This may be understood with reference to FIGS. 2a and 2b which illustrate a side view of a parallel plate waveguide transmission line implemented in a coil suitable for imaging, e.g., a forearm. It should be appreciated that the parallel plate transmission line described herein is not limited to imaging a forearm but may be applicable to imaging any body part.

Figure 2A:
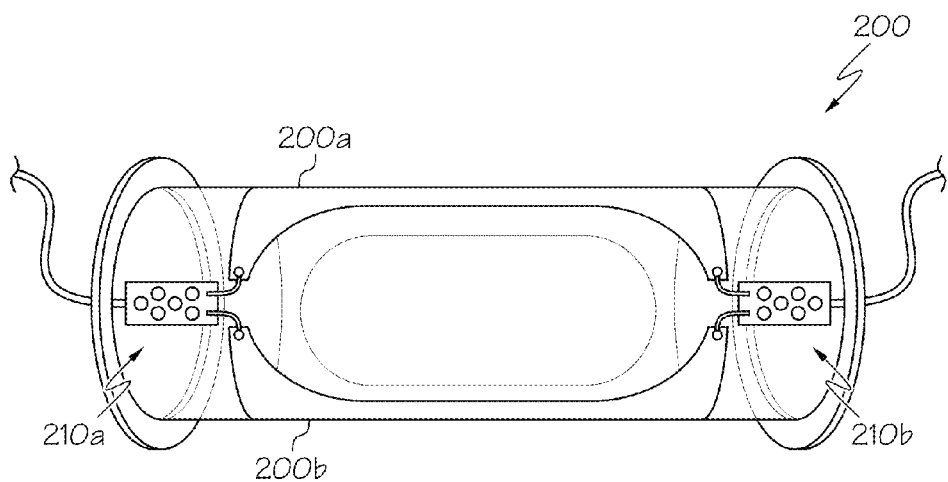
FIG. 2a illustrates a side view of a parallel plate waveguide coil according to a first illustrative embodiment.
Figure 2B:
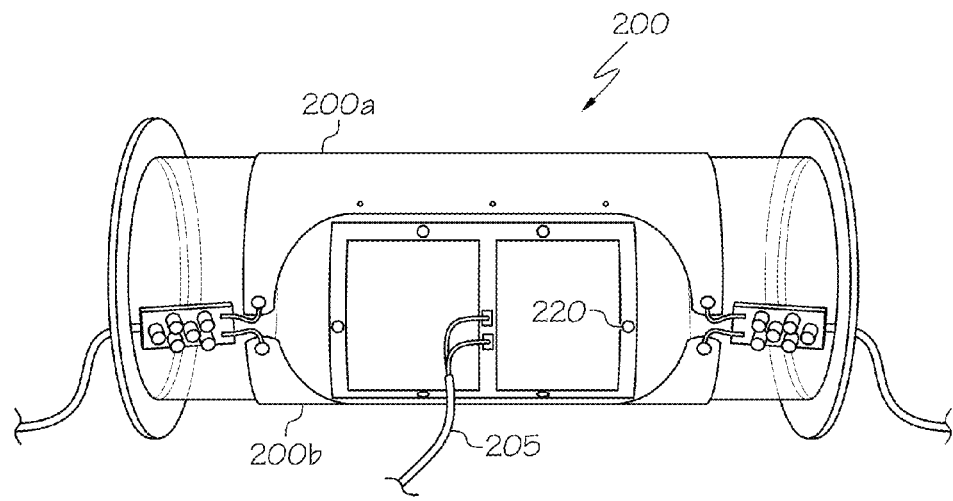
FIG. 2b illustrates a side view of a parallel plate waveguide volume coil according to the first illustrative embodiment.

As shown in FIGS. 2a and 2b, the waveguide transmission line 200 is split into two halves, 200a and 200b with gaps in between. As shown in FIG. 2b, a coaxial cable 205 may be connected to a receiver 220 to feed signals emitted by a target to a computer for processing and production of an image. This configuration effectively transforms the impedance of the TEM mode to a parallel combination of two impedances. For the tapered conical transmission line on each side, the input impedance is twice the impedance of the TEM mode.

To aid in understanding, an example of a coil suitable for imaging the forearm constructed to demonstrate the feasibility is described herein. Copper foils (3M, Saint Paul, Minn.) of 7 cm wide and 20 cm long were laid on the outside of an acrylic tube (McMaster-Carr, Elmhurst, Ill.) with a 10.8-cm outer diameter (OD). The corresponding distance-to-width ratio of the parallel-plate waveguide was 1.54. Each copper foil was split at the ends and tapered down to form a 1-cm gap. The entire coil structure does not have any reactive components for tuning.

Figure 4C:
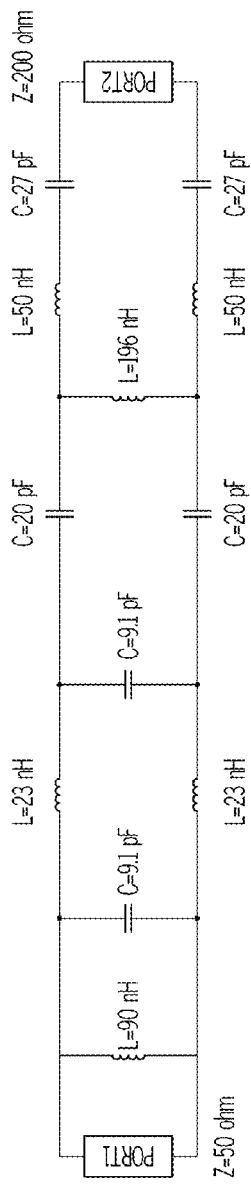
FIG. 4c is a schematic of a Chebyshev matching network.

Broadband Chebyshev matching networks were connected across each gap to transform 50-Ohm cable impedance to the input impedance at a gap from 100 to 300 MHz. It was implemented symmetrically for common-mode suppression. An example schematic of a Chebyshev matching network is shown in FIG. 4c.

Figure 4D:
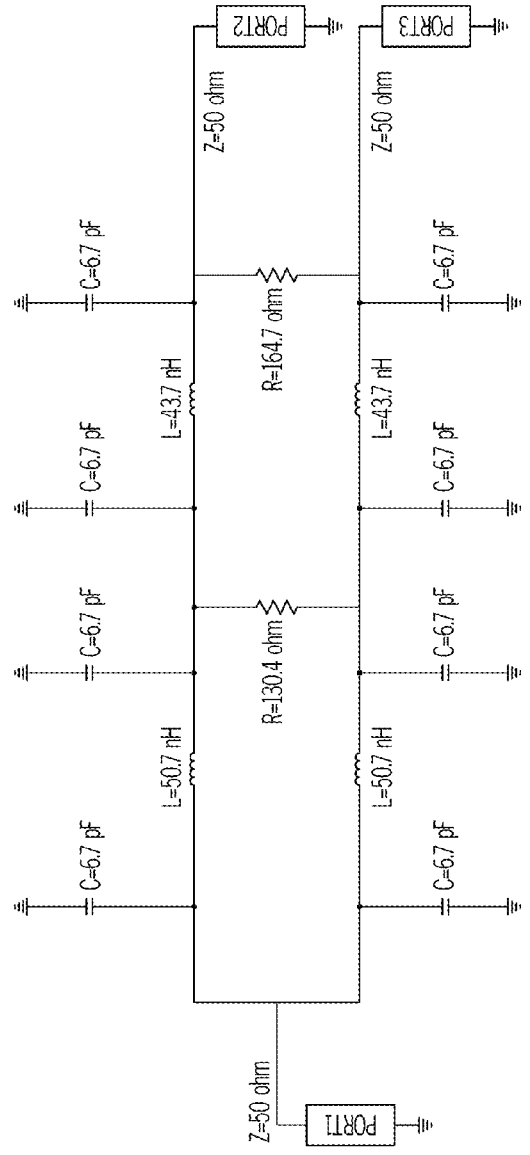
FIG. 4d is a schematic of a broadband Wilkinson power divider.

At one end of the waveguide 200, a broadband Wilkinson power divider was applied to split the RF input equally and in-phase. The Wilkinson power divider is not shown in FIG. 2a in the interest of simplifying the illustration. An example schematic of a Wilkinson power divider is shown in FIG. 4d. Outputs of the Wilkinson power divider were connected to the Chebyshev matching network.

At the other end of the waveguide, a broadband Wilkinson power combiner was used to combine the RF energy flowing out of the waveguide. The combined RF energy was then fed back to the input by using a third Wilkinson power combiner to form a re-entrant scheme.

The Chebyshev matching networks and the Wilkinson power dividers/combiners are referred to in FIG. 2a with reference numerals 210a and 210b.

FIG. 4a illustrates a simplified schematic of a parallel plate waveguide transmit coil 400 according to one aspect. As shown in FIG. 4a, a Wilkinson power divider 410b and a Wilkinson power combiner 410a are connected to Chebyshev broadband matching networks 405a, 405b at the input and 405c, 405d at the output of the volume coil including the transmission line 400. A third Wilkinson power combiner 410c is connected to the Wilkinson power divider 410b. In order to make this recirculating termination scheme works, the re-entrant branch was adjusted in-phase with the direct RF input using a phase shifter 435.

FIG. 4b illustrates a detailed schematic of a parallel plate waveguide transmit-receive coil according to another aspect.

In the diagram shown in FIG. 4b, the rightmost PIN diode 415 is switched on during RF transmission. After going through the diplexers 420a and 420b, the proton and phosphorous circuits are separate. The phase shifters 430a and 430b ensure that at 120.3 MHz (for phosphorous) and 297.2 MHz (for proton), the RF input from one end of the Wilkinson power combiner 410b is in phase with that from system power supply. Additional Wilkinson power combiners 410c are connected to the phase shifters 430a and 430b.

It should be noted that the Wilkinson power combiner works in an even mode when its inputs are fed by equal amounts of RF power. Since the two inputs are at equal potential, the interconnecting resistors are superfluous without actual currents flowing through and, therefore, without power loss. This is different from bench measurement conditions where only one input is connected to RF power supply and the other is terminated by passive load. In that scenario, the Wilkinson works in the combination of even and odd modes with half of the RF power lost in the interconnecting resistor(s).

It should further be appreciated that although the Chebyshev matching circuits and Wilkinson power combiners and dividers are described herein, the invention is not limited to only these types of matching circuit and power combiners/divers. Any appropriate matching circuits and power combiners/dividers may be used.

The design of all front-end circuitry was facilitated by using ADS (Agilent Technologies, Palo Alto, Calif.). All capacitors were ATC-100B series (American Technical Ceramics, Huntington Station, N.Y.) with the exact component values denoted in FIG. 2. The inductance was implemented by 164- and 165-series tunable inductors (Coilcraft, Cary, Ill.). Two types of PIN diodes, i.e., UM9415B (Microsemi, Aliso Viejo, Calif.) and MA4P7470-1072T (M/A-COM, Lowell, Mass.), were applied for the T/R switches. Bench measurements were performed by using an Agilent E-5061A network analyzer (Agilent Technologies, Palo Alto, Calif.). A 1.25-L phantom, which was 20-cm tall and 8-cm wide bottle filled with 55-mM NaCl and 100-ml phosphate, was prepared for bench measurement and phantom imaging.

For comparison purposes, an eight-rung unshielded linear high-pass birdcage coil was constructed by taping ⅜" wide copper foil on an acrylic cylinder of 10.8-cm OD, which was the same as the parallel-plate waveguide. The length of the birdcage was also the same as the parallel-plate waveguide. It was tuned and matched to 297.2 MHz with the saline phantom by using 2.3 pF capacitors.

Turning now to the receiver design, according to an illustrative embodiment, signal reception follows the principle of open-circuited transmission-line resonator. For better SNR, it is preferred to sense the induced voltage rather than the current. This was achieved by adjusting the total electrical length of an open-circuited transmission line to be equal to multiples of a half wavelength, such that the overall length of the transmission line resonator is equal to an odd number of wavelengths of the resonant frequency of the received signal, and connecting one end of the open-circuited waveguide to a low-noise pre-amplifier (LNA) with a high input impedance. Referring again to FIG. 4d, the rightmost PIN diode 415 is switched off during signal reception, which creates one open end of the transmission line.

At each frequency, the phase measured between the PIN diode 415 and the input of the low noise preamplifiers through the Wilkinson power dividers/combiners 410a, 410b, the parallel-plate waveguide 400, the diplexers 420a, 420b, and the T/R switches 440a, 440b was adjusted to be equal to multiples of 180°. The high-impedance low noise preamplifiers were implemented by using an ATF-54143 low-noise enhancement mode pseudomorphic HEMT (E-pHEMT) transistor (Avego Technologies, San Jose, Calif.) for the first stage and a BFP-720 low-noise Silicon Germanium (SiGe) bipolar transistor (Infineon Technologies, Neubiberg, Germany) for the second stage at 120.3 and 297.2 MHz respectively. At both frequencies, the quiescent point of the ATF-54143 was 3V/40 mA and that of the BFP-720 was 3V/15 mA. The input matching network of the first-stage transistor was adjusted to provide large impedance when looking into it.

Full-wave computer simulations were performed by using FEKO (EMSS S.A. Pty Ltd, South Africa) and XFDTD (Remcom Inc., College Station, Pa.). FEKO was applied to determine the input impedance of the parallel-plate waveguide with the 20-cm long and 8-cm OD cylindrical phantom used in experiments ($\epsilon_r=78$, $\sigma=0.657$ S/m). Resistors were connected to the four gaps of the waveguide and uniformly adjusted until the reflection coefficient at one gap was below −10 dB from 100 to 300 MHz.

XFDTD was used to examine the $B_1^+$ uniformity and the local SAR inside the forearm of the Duke human model. The geometry of the parallel-plate waveguide was the same as in FEKO simulations. The mesh size was 2 mm isotropic. Ten layers of perfectly matched layer (PML) absorbing boundary condition were applied in each direction and separated from the coil model by a 40-layer buffer zone. Tissue properties were specified according to literatures at 120.3 and 297.2 MHz respectively. Two in-phase 1-V voltage sources were applied across the gaps at one end of the parallel-plate waveguide with source impedances equal to that determined by FEKO. The two gaps at the other end of the waveguide were passively terminated by using the same amount of resistance. Time-domain simulations were run long enough to ensure numerical convergence. The frequency-domain electromagnetic fields were obtained by the Fourier transform and applied to compute $B_1^+$ maps and the local SAR. The $B_1^+$ was normalized by the square root of the total RF power, which represents the transmit efficiency. The 10-g averaged local SAR was normalized to 1-Watt RF power absorption by the forearm. The radiation efficiency, i.e., the ratio of radiated power to the sum of radiated and absorbed powers, was also calculated.

The eight-run unshielded linear birdcage coil was also simulated at 297.2 MHz by using the XFDTD. The coil conductor was modeled as wire filaments. The capacitors on the end-rings were adjusted to 1.6 pF for the birdcage mode to occur at 297.2 MHz in simulations, which is lower than its hardware implementation. This is mainly because modeling the coil conductor as filaments increases the coil inductance and, therefore, decreases the required tuning capacitance. A 1-Volt voltage source with 50-Ohm source impedance was applied for excitation. The rest of the simulation procedure was the same as that for the parallel-plate waveguide. This procedure was repeated at 120.3 MHz with the forearm model. The tuning capacitance was 12.1 pF. In addition, both the parallel-plate waveguide and the birdcage coil were simulated with the saline phantom and a gel phantom ($\epsilon_r=2$, $\sigma=0$ S/m) at 297.2 MHz.

A 7T MRI scan was performed on a Siemens MAGNETOM scanner (Siemens Medical Systems, Erlangen, Germany) at Auburn University. Proton $B_1^+$-map in the saline phantom was acquired by using Siemens' product sequence based on the double-angle method. The scan parameters were 1000-ms TR, 14-ms TE, 300-mm-by-300-mm FOV, and 256-by-256 matrix size. The turbo spin-echo (TSE) image of the same phantom was also acquired by using 3600-ms TR, 87-ms TE, 179-mm-by-199-mm FOV, 362-by-448 matrix size, and one average. The TSE image of the human forearm was acquired by using the same parameters but a slightly shorter 83-ms TE. For comparison, the gradient echo (GRE) image of the forearm was acquired by using 8.6-ms TR, 3-ms TE, 250-mm-by-250-mm FOV, 512-by-512 matrix size, and one average.

The proton transmit efficiency was measured with the 1.25-L phantom by using a free induction decay (FID) sequence with a 1-ms rectangular pulse, 1500-ms TR, and 1.1-ms TE. The RF power was increased incrementally until maximum signal intensity was detected. The finest voltage resolution is 2-V (peak RF voltage reading from scanner). The same procedure was repeated for the unshielded linear birdcage coil with a dedicated proton interface box that consists of a T/R switch and a low-impedance LNA. The power loss of each front-end circuit was considered when calculating the peak RF voltage required for maximum signal intensity. Phosphorous spectroscopy of the human forearm was performed by using a Siemens' product CSI sequence. Scan parameters were 1500-ms TR, 0.1-ms TE, 5-kHz acquisition bandwidth, 25-mm cubic volume size, and 16 averages.

Figure 3A:
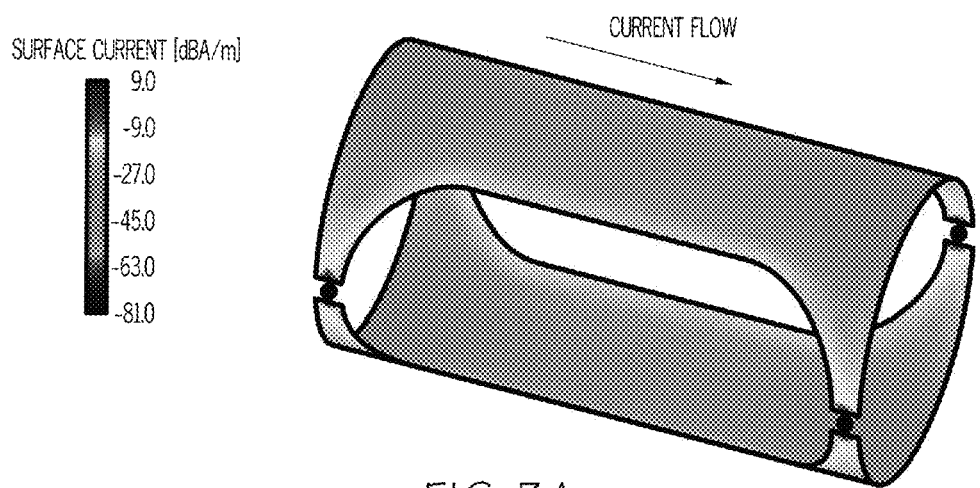
FIGS. 3a and 3b illustrate simulated current distributions at 120.3 MHz and 297.2 MHz, respectively, using FEKO.
Figure 3B:
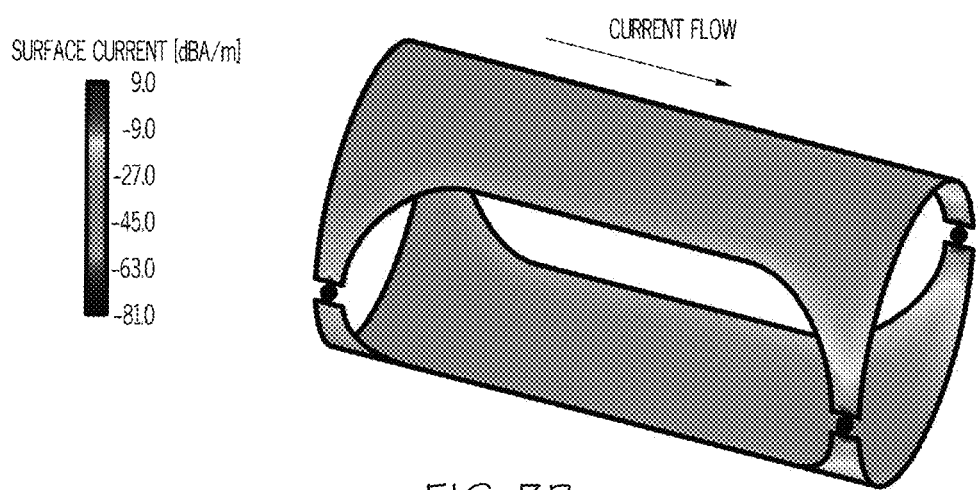

By using an effective relative permittivity of $\epsilon_r=39.5$, which is the average of those of air and water, the impedance of the parallel-plate waveguide was estimated to be $Z_{TEM}=92$ Ohm by Eq. (3). Accordingly, the input impedance at each feeding port was estimated to be 184 Ohm. When terminating each port by a 200-Ohm resistor, the simulated reflection coefficient was less than −10 dB from 100 MHz to 300 MHz. In this condition, nearly uniform current distributions along the longitudinal direction across the top and bottom of the parallel plate waveguide were observed, as illustrated in FIGS. 3a and 3b. In the transverse direction, currents mostly flowed along the edges.

Figure 5A:
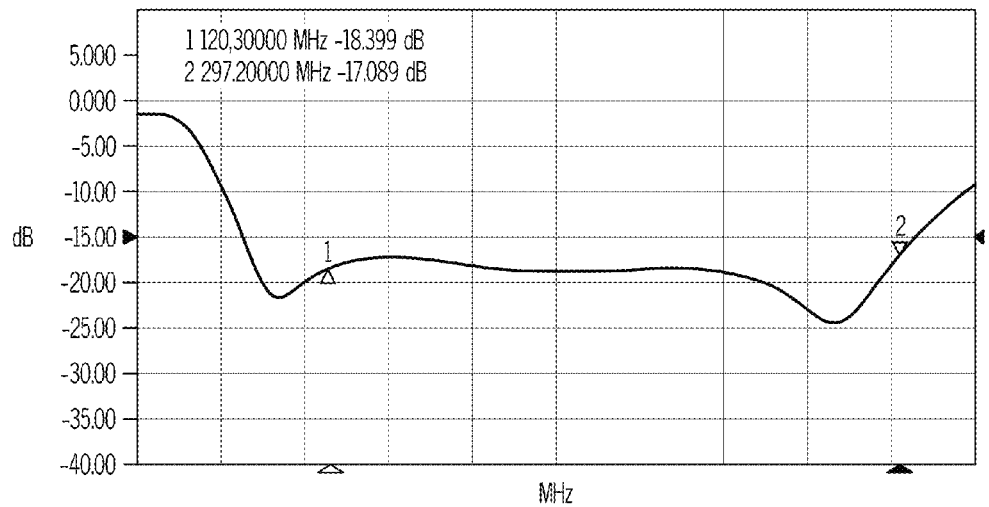
FIG. 5a illustrates a measured reflection coefficient from the Chebyshev matching network.
Figure 5B:
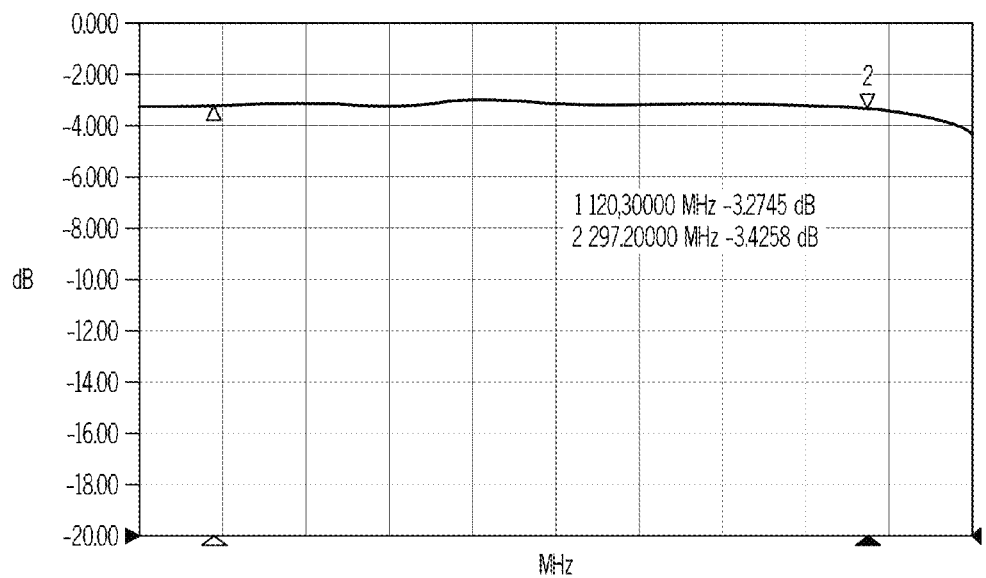
FIG. 5b illustrates a measured power dividing ratio of the broadband Wilkinson power divider.

A broadband Chebyshev matching network was designed to match 50 Ohm (cable impedance) to 200 Ohm (FIGS. 4c and 4d). The measured reflection coefficient was lower than −15 dB from 100 to 300 MHz, as graphically depicted in FIG. 5a. Bench measurement of the broadband Wilkinson power divider is shown in FIG. 5b which illustrates the measured power dividing ratios of the broadband Wilkinson power divider. The power dividing ratios were −3.3 dB and −3.4 dB, and the phase differences were 1° and 3° at 120.3 and 297.2 MHz respectively. The measured insertion loss of the diplexer was −39 dB in the stop-band and −0.3 dB in the pass-band. The overall loss of the RF front-end circuit for the parallel-plate waveguide was −2.0 dB and −2.5 dB at 120.3 and 297.2 MHz respectively. The loss of the RF front-end circuit for the linear birdcage coil was −0.3 dB at 297.2 MHz.

The measured reflection coefficient from one termination of the parallel-plate waveguide when loaded with the saline phantom was −15.6 dB and −15.9 dB at 120.3 and 297.2 MHz respectively. When loaded with the forearm, they were −17.4 dB and −16.6 dB respectively. The measurement was performed by connecting a network analyzer to the input of the broadband Wilkinson divider and a 50-Ohm termination behind the broadband Wilkinson combiner on the opposite side. The reflection coefficient of the birdcage coil was −13.1 dB when measured with the saline phantom at 297.2 MHz.

FIGS. 6a-6b and FIGS. 6c-6d show the simulated $B_1^+$ distribution of the parallel-plate waveguide inside the forearm model at 120.3 MHz and 297.2 MHz, respectively. The $B_1^+$ distribution of the birdcage coil at 297.2 MHz is shown in FIGS. 6e and 6f, which are nearly identical to that of the parallel plate waveguide coil described herein.

Figure 7A:
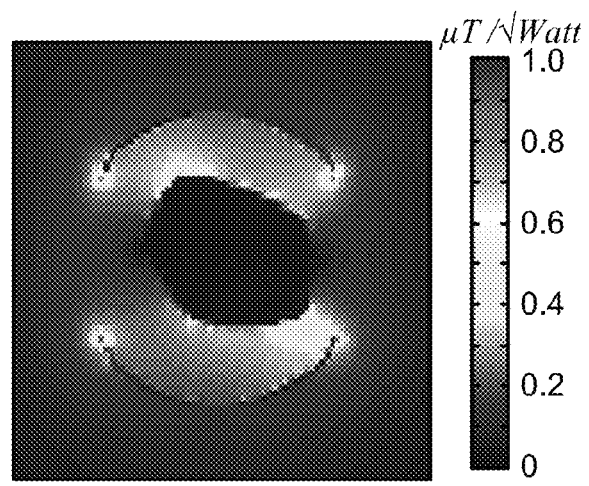
FIGS. 7a and 7b illustrate the normalized electric field distribution of a parallel-plate waveguide at 120.3 MHz and 297.2 MHz, respectively.
Figure 7B:
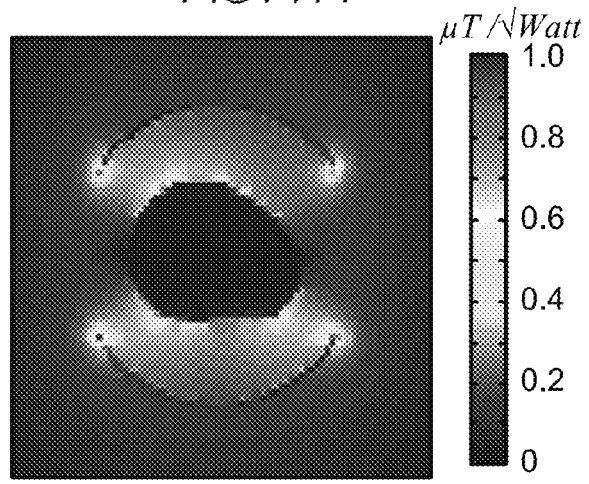
Figure 7C:
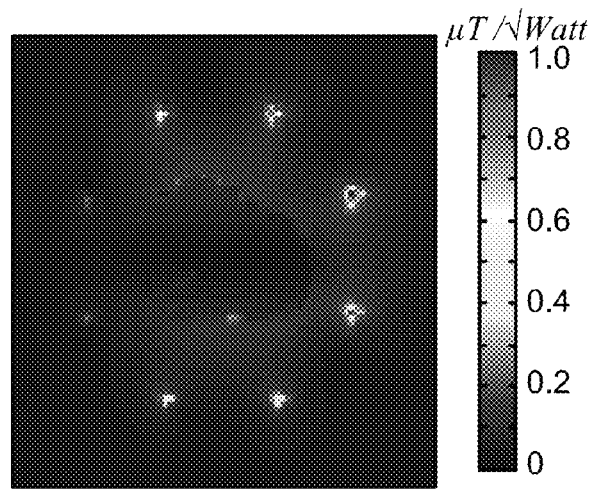
FIG. 7c illustrates the normalized electric field distribution of a birdcage coil at 297.2 MHz.

FIGS. 7a and 7b show the normalized electric field distributions of the proposed coil on a transverse plane at 120.3 and 297.2 MHz, respectively, which are similar outside the arm. At 120.3 MHz, the maximum voxel-wise $B_1^+$ magnitude was 4.3 and 5.8 µT/Watt for the parallel-plate waveguide and the birdcage coil. At 297.2 MHz, it was 1.5 and 1.8 µT/Watt respectively. FIG. 7c illustrates the normalized electric field distribution of the birdcage coil at 297.2 MHz.

Figure 8A:
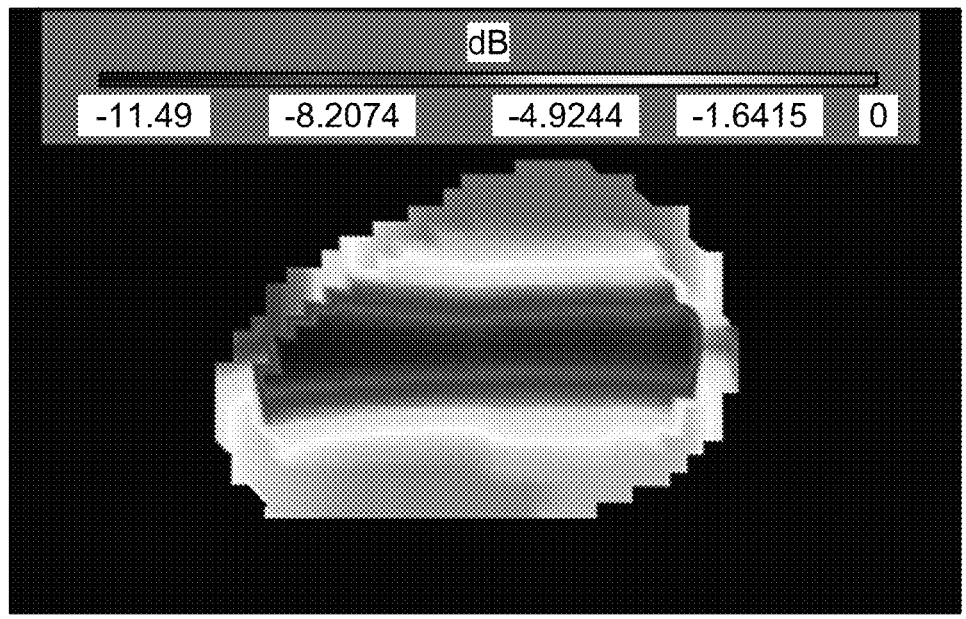
FIGS. 8a and 8b illustrate the 10-g averaged local SAR distribution of the parallel-plate waveguide and the birdcage coil, respectively, at 297.2 MHz.
Figure 8B:
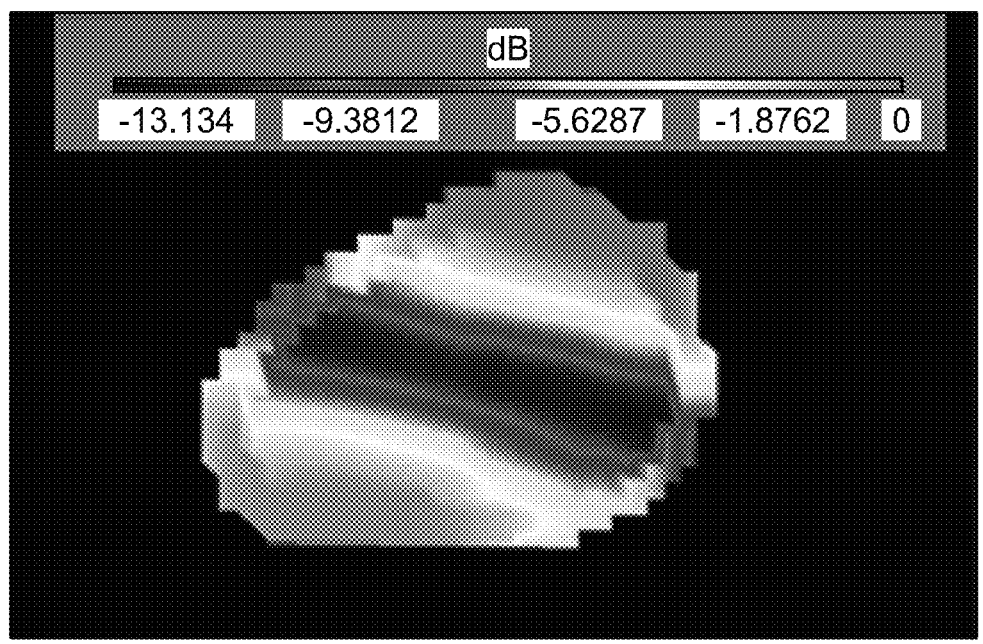

FIGS. 8a and 8b illustrate a10-g averaged local specific absorption rate (SAR) measured at 297.2 MHz using the parallel plate waveguide and a birdcage coil, respectively. As can be seen from FIG. 8a, the peak value of the SAR measured using the parallel plate waveguide was 4.8 Watts/kg/Watt. In comparison, as shown in FIG. 8b, the peak local value SAR measured using the birdcage coil was 5.6 Watts/kg/Watt. The maximum voxel-wise $B_1^+$ magnitude was 0.69 and 0.76 µT/Watts/kg/Watt at 297.2 MHz for the parallel-plate waveguide and the birdcage coil, respectively.

Figure 9A:
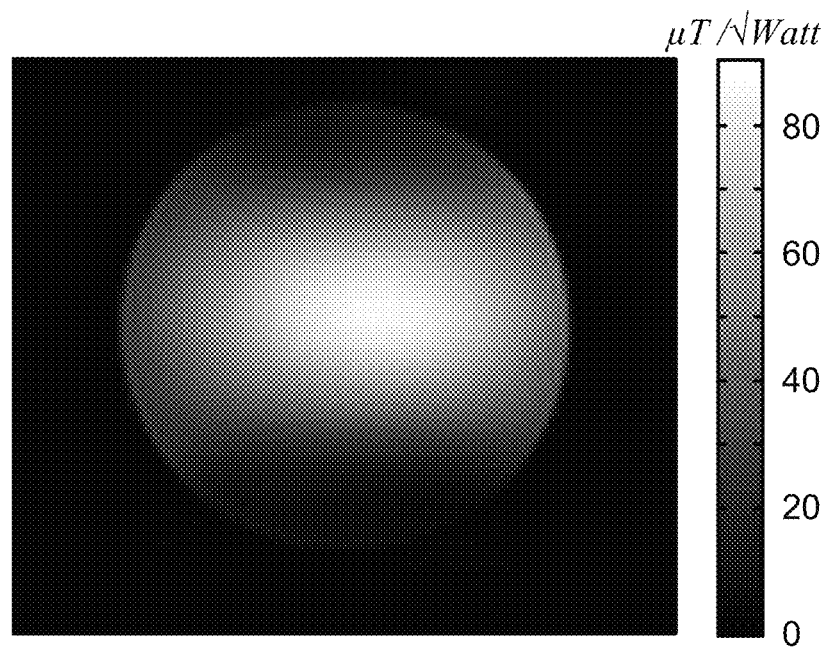
FIG. 9a illustrates the measured $B1^+$ map of a TSE image.
Figure 9B:
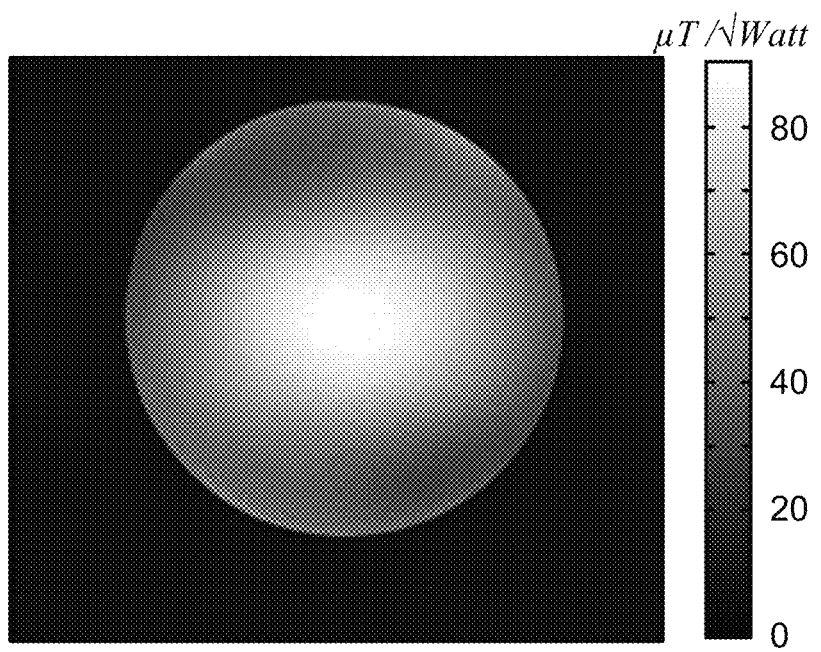
FIG. 9b illustrates a simulated flip-angle $B1^+$ map (degrees).
Figure 9C:
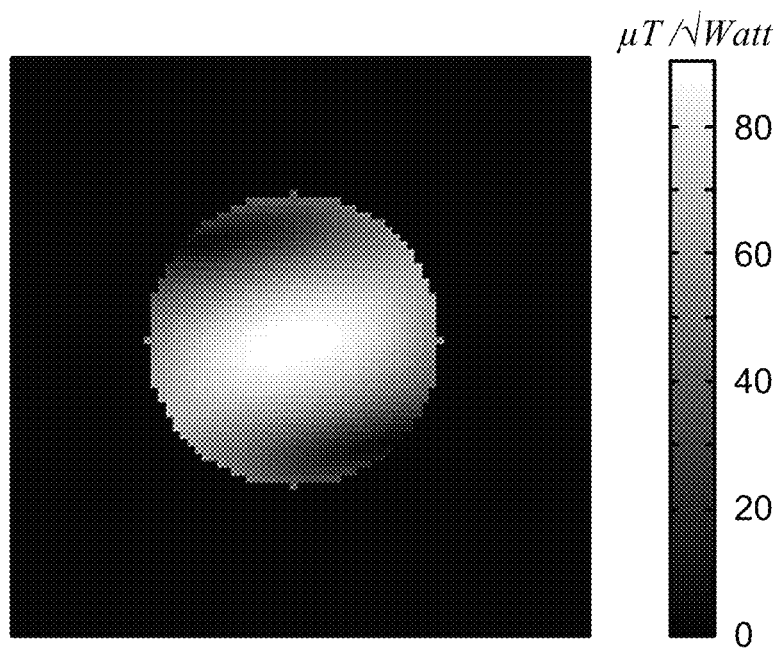
FIG. 9c illustrates the measured $B1^+$ map inside a water phantom.
Figure 9D:
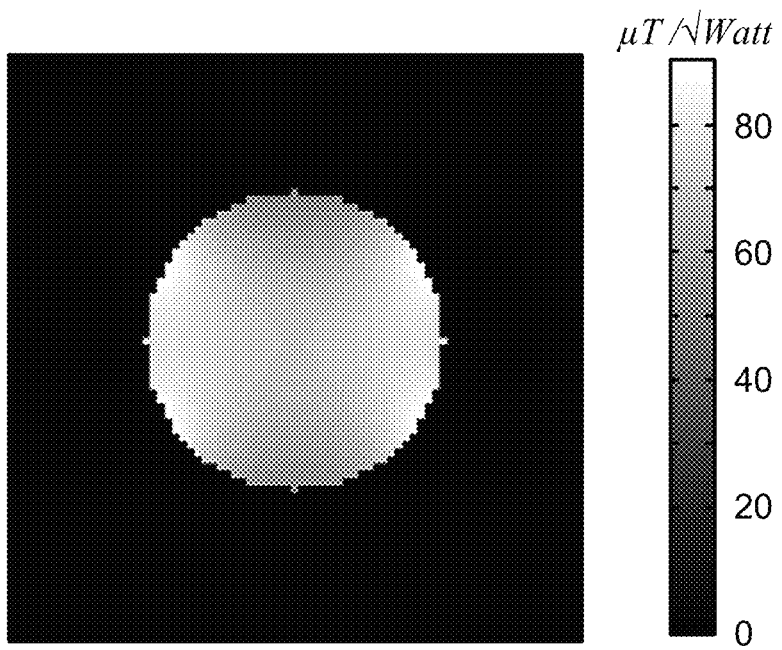
FIG. 9d illustrates the measured $B1^+$ map of a gel phantom.

FIG. 9a illustrates the measured $B1^+$ map of a TSE image, FIG. 9b illustrates a simulated flip-angle $B1^+$ map (degrees), FIG. 9c illustrates the measured $B1^+$ map inside a water phantom, and FIG. 9d illustrates the measured $B1^+$ map of a gel phantom. It should be noted that the double-angle method is not optimal in regions of low signal intensity. Thus the $B_1^+$-map is qualitative, not quantitative. The simulated maximum voxel-wise $B_1^+$ magnitude in the saline phantom was 1.4 and 1.5 µT/√Watt for the parallel-plate waveguide and the birdcage coil respectively. The radiation efficiency was 6% for the birdcage coil and 8% for the parallel-plate waveguide when loaded with the saline phantom at 297.2 MHz. When loaded with the forearm, the radiation efficiency was 44% and 53% at 297.2 MHz for the birdcage coil and the parallel-plate waveguide respectively. At 120.3 MHz, both coils have the same radiation efficiency of 21%.

Figure 10A:
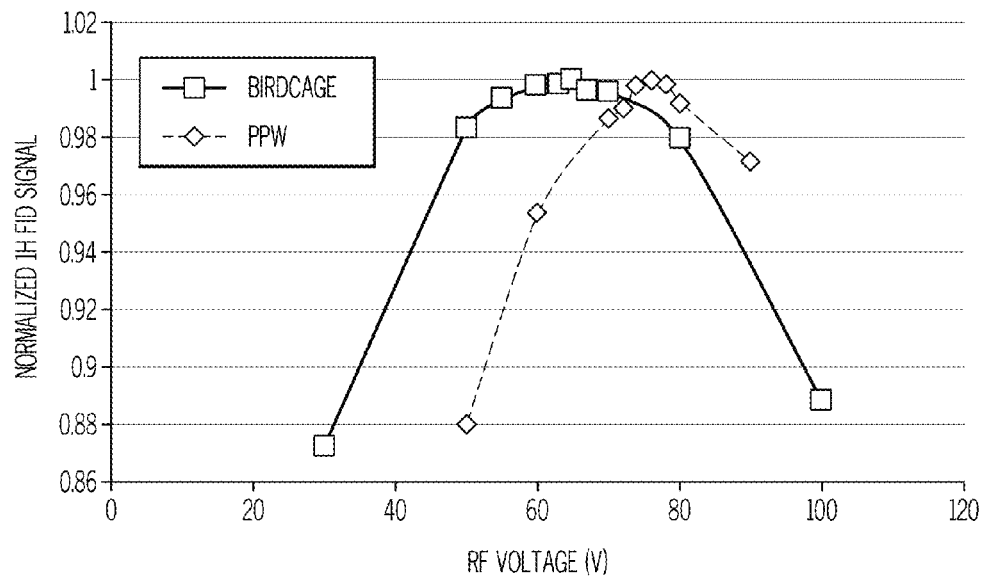
FIG. 10a illustrates the directly measured transmit efficiency of the parallel-plate waveguide and the birdcage coil loaded with a saline water phantom.
Figure 10B:
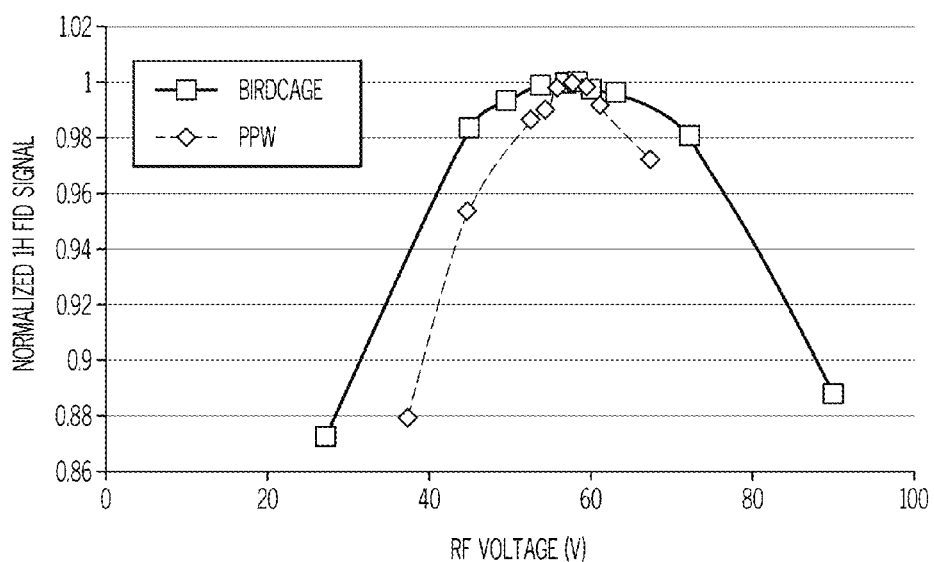
FIG. 10b illustrates the calibrated transmit efficiency of the parallel-plate waveguide and the birdcage coil loaded with a saline water phantom.

The measured proton transmit efficiency for the parallel plate waveguide and the birdcage coil is shown in FIG. 10a. Maximum signal intensity was observed with a peak (non-RMS) RF voltage of 76 V and 65 V (scanner reading) for the parallel-plate waveguide and the birdcage coil, respectively. Considering the loss of the front-end circuit and coil mismatch, the maximum signal appeared at 57 V for both coils, as can be understood with reference to FIG. 10b which shows the transmit efficiency of the parallel-plate waveguide and the birdcage coil loaded with the saline water phantom.

Figure 11A:
FIGS. 11a and 11c illustrate turbo spin echo (TSE) images of the forearm at 71.
Figure 11B:
FIGS. 11b and 11d illustrate gradient echo (GRE) images of the forearm at 7T.
Figure 11C:
Figure 11D:
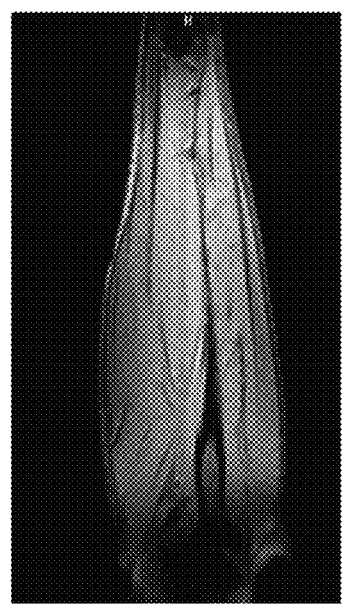

The TSE and GRE images of the forearm and $^{31}$P CSI results are shown in FIGS. 11a and 11b and in FIGS. 11c and 11d, respectively. Coverage of the entire forearm was observed on both GRE and TSE images. The low tip-angle GRE image appears to be more uniform than the TSE image on the transverse plane.

Figure 12:
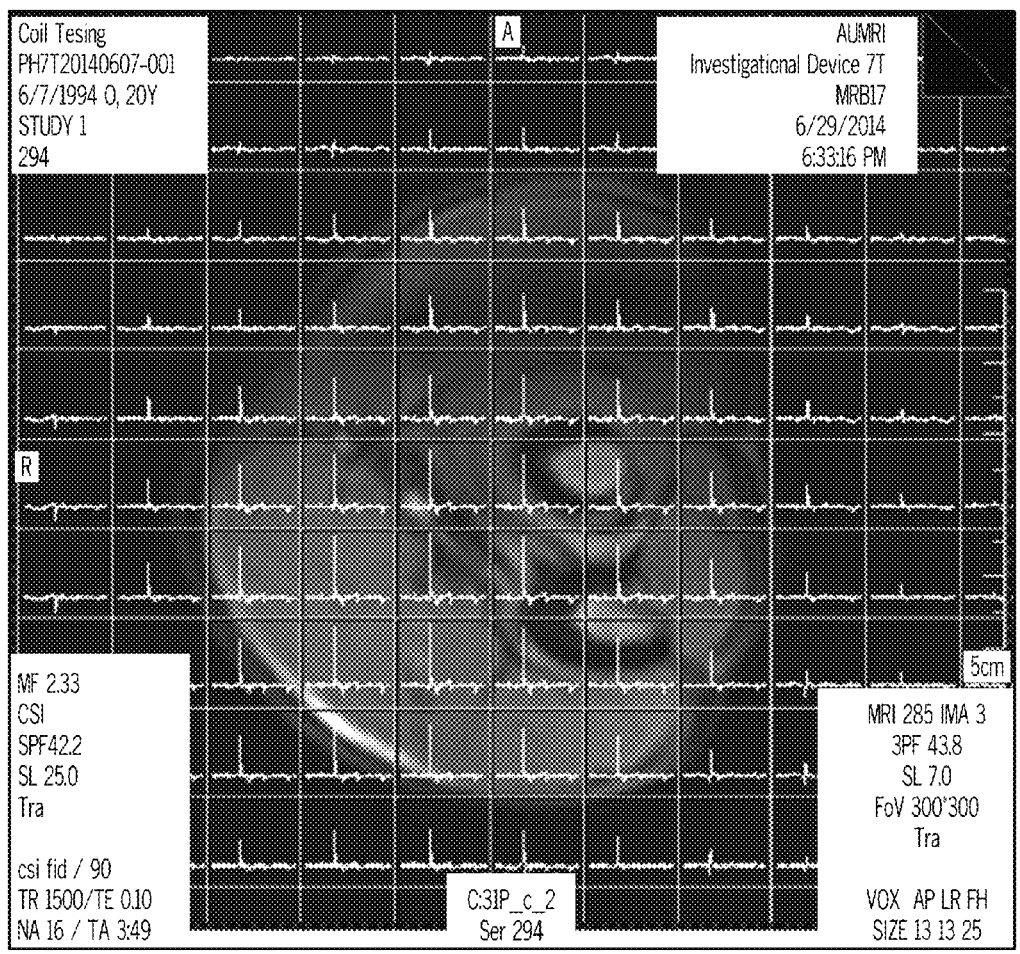
FIG. 12 illustrates a phosphorous chemical shift imaging (CSI) result overlapped on localizer image.
Figure 13:
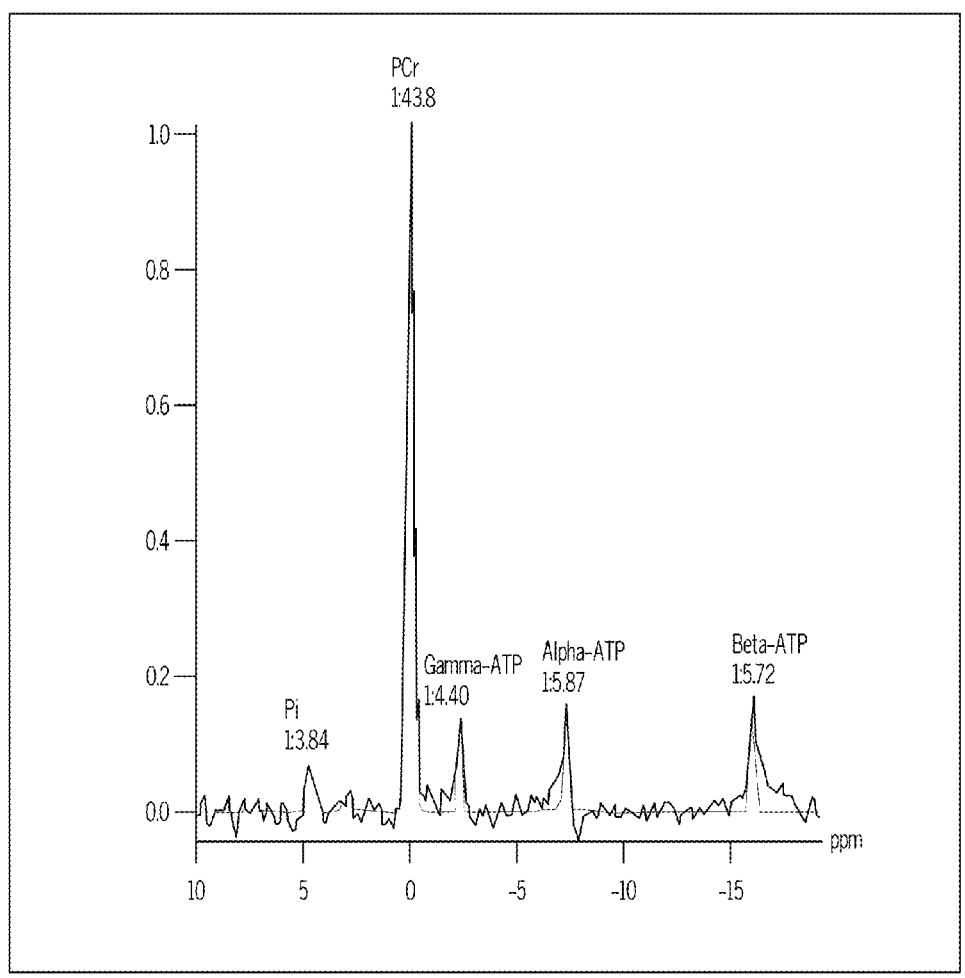
FIG. 13 illustrates an enlarged CSI result inside a single Voxel.

FIGS. 12 and 13 illustrate a phosphorous CSI result overlapped on a localizer image and an enlarged CSI result inside a single voxel, respectively. The acquired $^{31}$P CSI results shown in these figures demonstrate the feasibility of using the proposed coil for both signal transmit and reception in a broad frequency band.

Referring again to FIGS. 3a and 3b, these figures show that the currents on the parallel plates have similar distributions at 120.3 and 297.2 MHz. These currents are responsible for the distributed inductance of the transmission line.

FIGS. 7b and 7d show that the electric fields outside the forearm are mainly concentrated between the two plates and vary slightly at 120.3 and 297.2 MHz. They are responsible for the distributed capacitance of the transmission line. Since both the distributed inductance and capacitance are similar at different frequencies, the impedance of the TEM mode does not vary much with the frequency. It is a real number that depends on the distance-to-width ratio and the properties of the dielectric insert, not the absolute size of the coil.

The measured reflection coefficient of the parallel plate waveguide coil discussed herein is the combination of those of the parallel-plate waveguide, the broadband Wilkinson power divider/combiner and the Chebyshev matching circuit. It can be further reduced with optimized design of each component. On the other hand, the bandwidth discussed herein is intended to demonstrate the broadband feature of the parallel-plate waveguide. It may rarely be needed in practice except for multi-nuclear studies at high fields. Optimizing the coil performance around discrete Larmor frequencies is more relevant in practice, and the circuit design can be much simplified with a reduced bandwidth. In light of this, there exist well-established narrowband RF devices, such as phase-shifters, high-/low-impedance LNAs, and T/R switches, to support the common functionalities of RF coils. Since these narrowband devices belong to the RF front-end, which is usually located on a separate circuit board than the coil, the parallel plate waveguide can be used at various frequencies without modifying the coil itself.

The phase adjustment for re-entrant termination discussed above is performed separately for proton and phosphorous by using conventional PI-network. If a truly broadband system is desired, narrowband phase shifters can be replaced by various broadband designs.

The role of the re-entrant design is not to reduce the loss of the parallel plate waveguide coil, which is determined by radiation, power deposition in a target subject and component losses of the front-end. These losses are evident from the simulated transmit efficiency and bench measurement results. The re-entrant design is intended to recycle the part of RF power that flows out of the coil, which will otherwise go into a terminating load. Without recycling, a lossless transmission-line coil will have most of its input power being dumped into a terminating load.

The parallel plate waveguide coil discussed herein is relatively easier to construct than birdcage coils. It is formed by two pieces of copper foils without any reactive components. Once the impedance of the TEM mode is known, it only requires appropriate matching to cable impedance. Tuning the correct operating mode to the desired Larmor frequency by using reactive components, which is mandatory for resonant coils, is no longer needed. Such tuning requires multiple iterations, if possible at all, at higher frequencies and the result can shift with different loadings. The parallel plate waveguide coil is more robust with different loading conditions due to its lack of resonant peaks and reactive components. This is evident from the similarity of the measured $S_{11}$ when loaded with a phantom and the forearm.

As noted above, the parallel-plate waveguide requires the suppression of higher-order modes. This may be accomplished by using balanced matching circuits for the TEM mode and impedance mismatch of higher-order modes. According to Eqs. (1) and (2), higher-order modes are more likely to occur at higher frequencies or with a larger distance between the plates. For 3T proton imaging, one wavelength in air is about 2.3 m. Higher-order modes are possible for an unloaded parallel-plate waveguide only if the distance between the plates is farther than 1.15 m, which is unlikely for existing MR scanners. When the effective permittivity introduced by the human body is considered, higher-order modes should not be a major concern because the space between the parallel plates is partially filled.

Figure 6D:
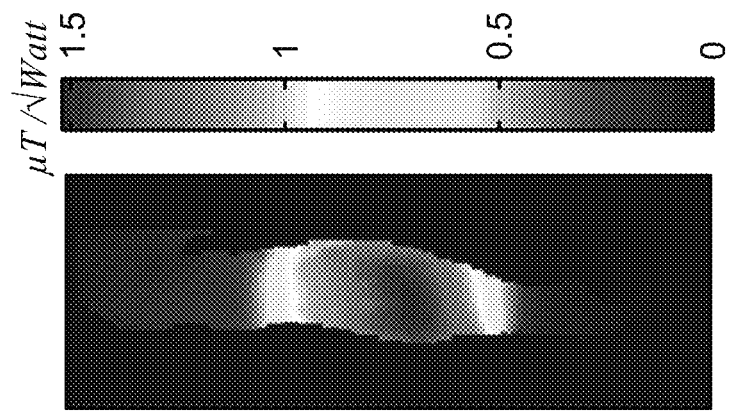
FIGS. 6c and 6d illustrate the $B1^+$ field of a parallel-plate waveguide at 297.2 MHz
Figure 6C:
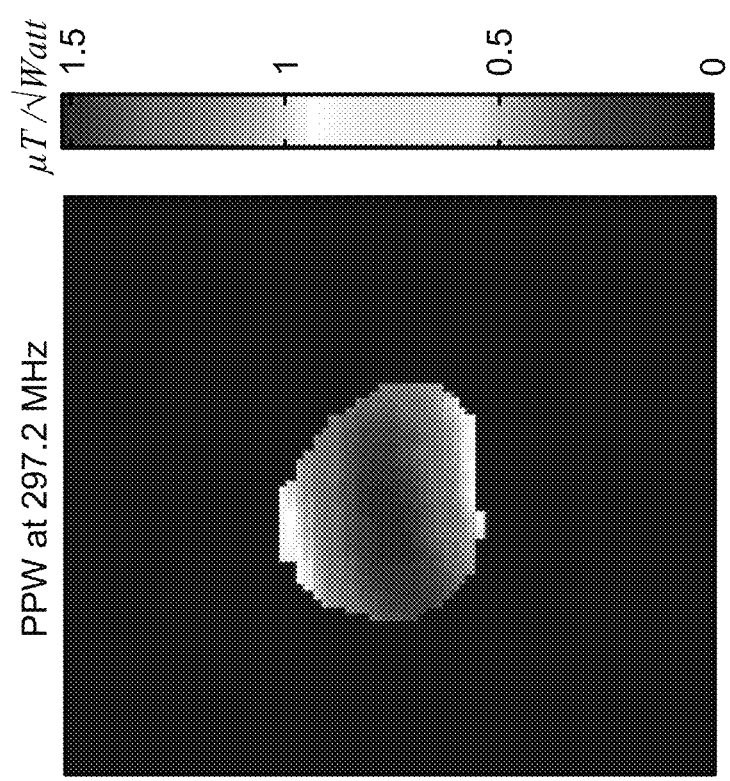
Figure 6E:
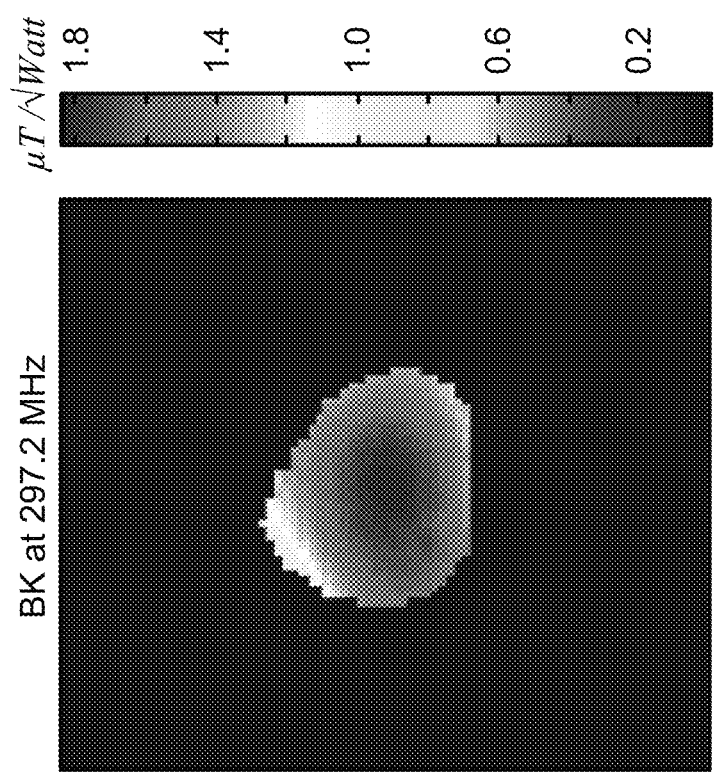
FIGS. 6e and 6f illustrate the $B1^+$ field of a birdcage coil at 297.2 MHz.
Figure 6F:
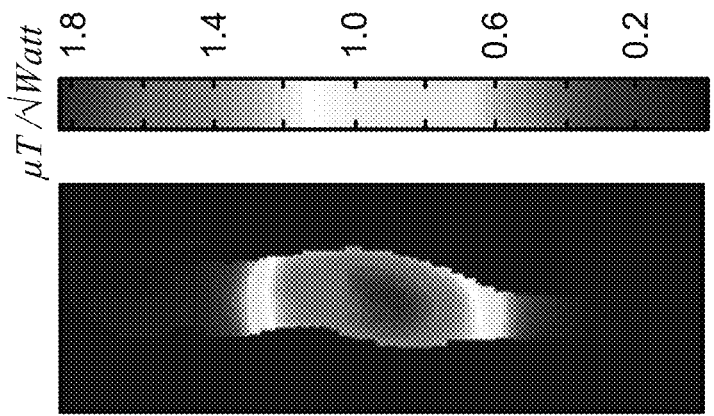

As can be seen from the simulation results at 297.2 MHz shown in FIGS. 6c-6f, the $B_1^+$ profile of the parallel-plate waveguide in the forearm is nearly identical to that of the birdcage coil. FIGS. 6c and 6e show the familiar center-bright pattern of both coils. Since higher-order modes were intentionally suppressed, $B_1^+$ non-uniformity is likely due to the dielectric resonance effect. This is evident from the simulated flip-angle map in a gel phantom in FIG. 9d, which shows a high degree of uniformity. Traveling-wave structures are not expected to prevent standing waves from forming inside a dielectric body. Wave attenuation may be a problem for traveling-wave coils.

FIGS. 6c-6f show that the longitudinal coverage of the 20-cm long parallel-plate waveguide at 297.2 MHz is as good as that of the birdcage coil. This was further confirmed by the sagittal forearm image in FIGS. 11c and 11d. At 297.2 MHz, neither the simulation result in FIG. 7bd nor the sagittal image indicates strong $B_1^+$ attenuation.

The finite coverage in the longitudinal direction of the parallel-plate waveguide should not be attributed to dielectric resonance or wave attenuation. FIGS. 3a and 3b demonstrate that currents, which generate the magnetic field for imaging, eventually flow into the terminations. Thus the coverage of parallel-plate waveguide cannot extend beyond its length. This is clear from FIGS. 7a and 7b, where the dielectric resonance effect in the forearm at 120.3 MHz is much less pronounced than 297.2 MHz.

The local SAR of the parallel-plate waveguide is about 14% less than that of the birdcage coil. They are on the same order but higher than that of a regular volume transmit coil. This should be mainly due to the close proximity between the coils and the forearm, not intrinsic to the proposed coil structure. The shortest distance between the coils and the forearm was less than 1 cm in simulations. For practical volume transmit applications where a separate surface coil array is typically positioned between the transmit coil and the subject, the local SAR is expected to be similar to that of a conventional birdcage coil.

The simulated radiation efficiency of the parallel-plate waveguide is the same as that of the birdcage coil at 120.3 MHz. At 297.2 MHz, the parallel-plate waveguide radiates more than the birdcage coil, but the difference is insignificant. A RF shield would be needed in order to make the parallel plate waveguide coil more efficient for MRI imaging. In this scenario, the two parallel plates and the RF shield form a multi-conductor transmission-line system. The radiation efficiency of both coils is reduced by seven folds when loaded with the 8-cm OD cylindrical phantom. This is because the human forearm is thinner (but oblong) than the cylindrical phantom and tapers from the elbow to the wrist. The coils were less loaded and more RF power is radiated. For the coils loaded with the cylindrical phantom, both their simulated and measured transmit efficiency at 297.2 MHz are about the same.

The parallel-plate waveguide is a volume coil in nature. Although it can be constructed as a transceiver, using receive-only surface coil arrays should be more appropriate if higher SNR is desired. In the meanwhile, the proposed signal reception by using open-circuited transmission-line resonator is not unique. Since the voltage at one open end of the transmission line is to be detected, whether the other end is open or short should be irrelevant. Therefore, one possibility is constructing a quarter-wavelength transmission-line resonator by grounding the rightmost PIN diode in FIG. 4b during signal reception.

According to an illustrative embodiment, a parallel-plate waveguide is provided for broadband MRI. The design principles and hardware implementations are described above. Also, as described above, full-wave simulations were performed to study its $B_1^+$ profiles and local SAR. 7T proton images and $^{31}$P CSI results acquired by using the same coil demonstrate its feasibility. Compared with resonant coils, the proposed coil is broadband in nature and relatively easier to construct. No reactive components are required for tuning. As a result, its performance is not susceptible to loading conditions.

There are many advantages provided by using the parallel plate waveguide described above. First, since the TEM characteristic impedance of the waveguide is only a function of its distance to width ratio and the relative permeability of the substrate filled and frequency independent, the parallel plate waveguide transmit coil is insensitive to the different loading unless the filling factor and loading material changed dramatically. Secondly, due to the nature of the TEM wave generated within the parallel plate waveguide, a homogeneous magnetic field can be obtained which is ideal for MRI transmission. Also, the broadband feature of the parallel plate waveguide can be employed for multi-nuclei excitation. As demonstrated above, it is feasible to use the same parallel plate waveguide transmit coil for acquiring both a proton image and a P31 spectrum signal.

Although a parallel plate waveguide is described herein, it should be appreciated that the invention is not limited to parallel plates. Other devices, such as robs, tubes, etc. may be used as long as the TEM mode is supported. Also, the two conductors need not be arranged in parallel but may be arranged in any geometric configuration as long as the TEM mode is supported.

According to another embodiment, a parallel plate waveguide may be used for larger volume transmission which has a wider MRI application range by employing a quadrature structure with two sets of parallel plate waveguides placed perpendicularly with respect to each other, thereby improving the transmit efficiency. Incorporated with the transmit coil, a four-channel coil array may be used as a receiver. As described in further detail below, both linear and quadrature structures were measured and the results were compared to demonstrate the increase in transmit efficiency.

As a practical point, when two sets of parallel plate waveguides are placed in close proximity, both magnetic and capacitive coupling between them needs to be taken into consideration during the coil design. However, the capacitive coupling of this coil is much more severe than magnetic coupling, and canceling the capacitive coupling is a more challenging goal to achieve.

In the coil fabrication described above for the parallel plate waveguide, in order to transform the characteristic impedance of the parallel plate waveguide to the system 50 ohm impedance, two split tapered transmission lines were used at each side of the coil. However, this technique makes the overlap between two parallel plate waveguide coils unavoidable, which introduces capacitive coupling. If observed from the feeding point, these capacitances generated by the copper foil overlapping are in parallel with the input impedance of the parallel plate waveguide coil in schematic. If the reactance of the coupling capacitance at the Larmor frequency is comparable to the coil input impedance, the current flow will be divided between the coil and coupling capacitors and will affect the coil performance negatively.

According to an illustrative embodiment, coil performance may be optimized by lowering the coupling capacitance value. For illustrative purposes, several decoupling strategies were used in the geometry design of the parallel plate waveguide coils. First, the length of the outer transmission line coil was increased by 4 cm at both sides so that the feed points of the outer coil can be kept away from the inner coil. Secondly, since the capacitance value is proportional to the size of the overlap area, cutouts were added at the overlap region of the copper foils to decrease capacitive coupling between two parallel plate wave guide coils as shown in FIGS. 14a and 14b.

Figure 14A:
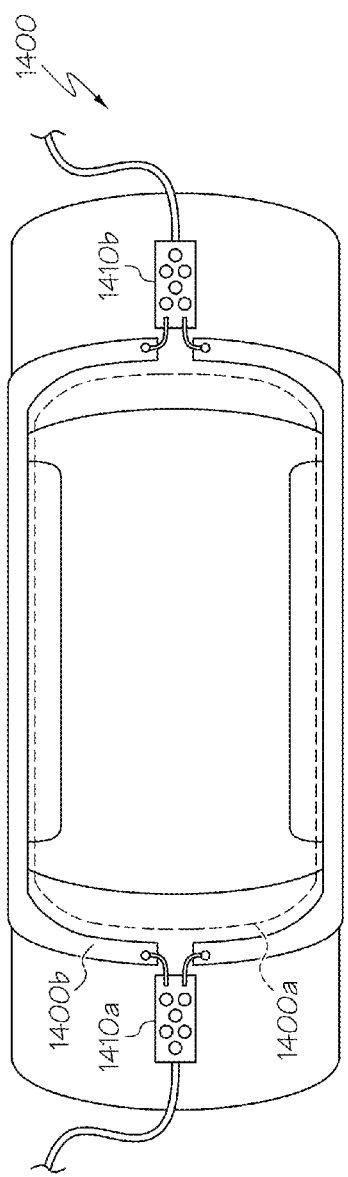
FIG. 14a illustrates a side view of a quadrature parallel plate waveguide according to a second illustrative embodiment.
Figure 14B:
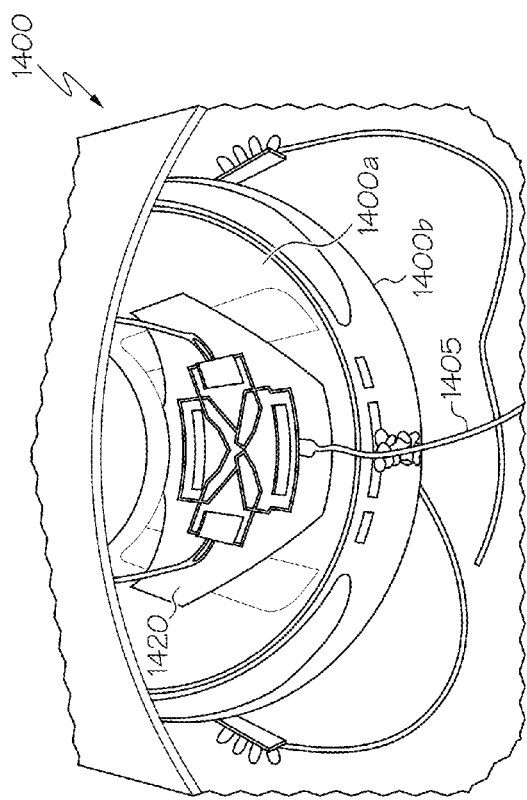
FIG. 14b illustrates an inside view of a quadrature parallel plate waveguide coil according to the second illustrative embodiment.

FIGS. 14a and 14b illustrate a side view and an inside view of a quadrature parallel waveguide according to an illustrative embodiment. The waveguide transmission line 1400 includes an "inner" parallel plate waveguide 1400a and an "outer" parallel plate waveguide 1400b. As shown in FIG. 14b, a coaxial cable 1405 may be connected to a receiver 1420 to feed signals emitted by a target to a computer for processing and production of an image.

Figure 15:
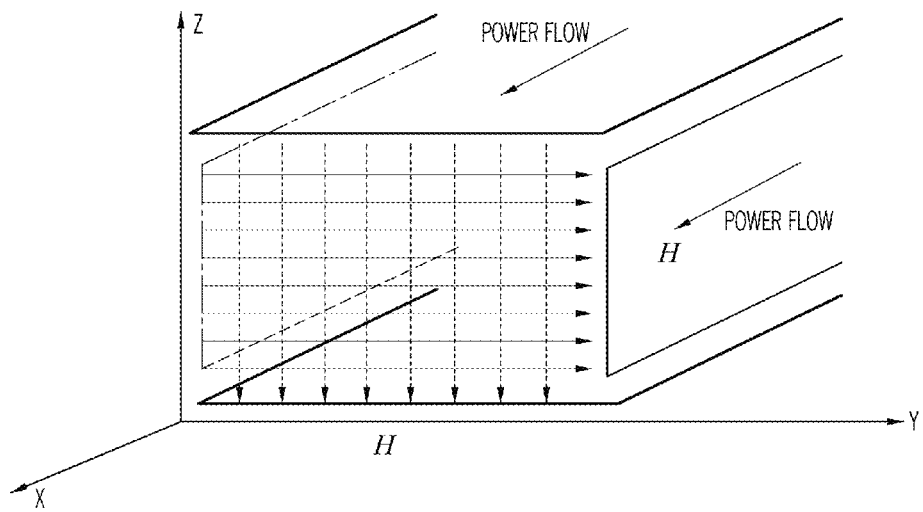
FIG. 15 illustrates and E field and an H field generated in a parallel plate waveguide.

To determine the specific positions and dimensions of the cutouts, numerical simulations were performed on EM simulation platform of FEKO (EMSS S.A. Pty Ltd, Stellenbosch, South Africa) and the following parameters were used as gauge of the capacitive coupling level. Theoretically, if a parallel plate waveguide is working in the TEM mode, its characteristic impedance will be a real number. But with another parallel plate waveguide coil positioned closely, the capacitive coupling will introduce imaginary part to the measured input impedance and a significant imaginary part can be observed. This may be understood with reference to FIG. 15 which illustrates the H-field generated within the parallel plate waveguide.

Figure 16:
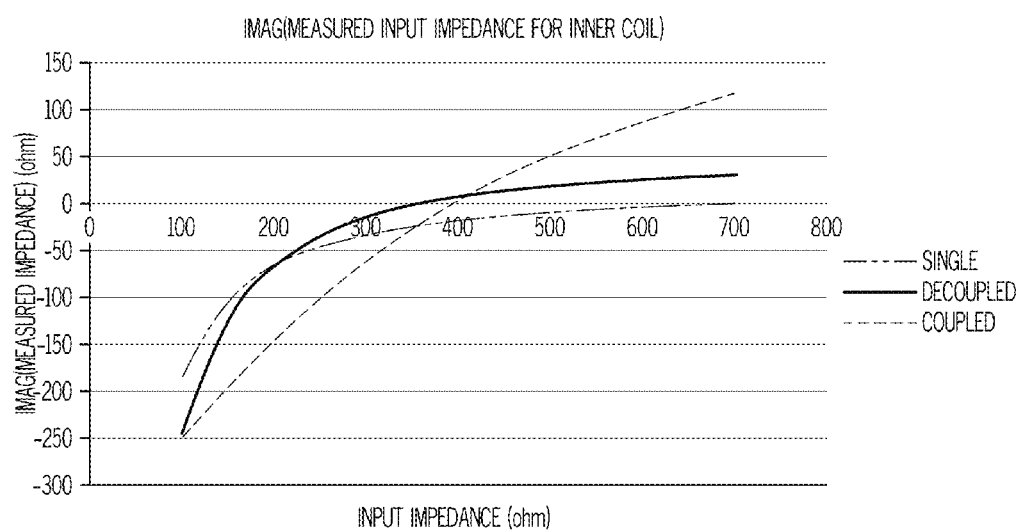
FIG. 16 illustrates a comparison of imaginary parts of input impedances of an inner coil of a quadrature parallel plate waveguide with a single inner coil, inner and outer coils with no decoupling, and inner and outer coils with decoupling according to the second illustrative embodiment.

During the simulation process, the location and size of the cutouts were adjusted carefully until the imaginary part within the input impedance was close to that of a single coil with no capacitive coupling existing. This may be understood with reference to FIG. 16 which shows a comparison of imaginary parts of input impedances of an inner coil of a quadrature parallel plate waveguide with a single inner coil, inner and outer coils with no decoupling, and inner and outer coils with decoupling.

Figure 17A:
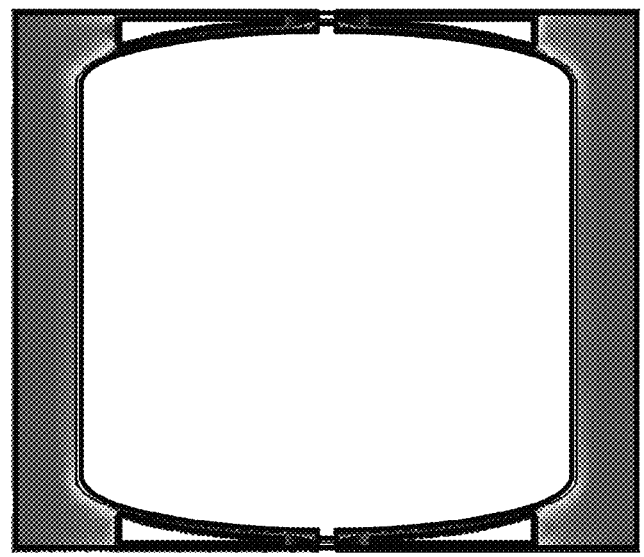
FIG. 17a illustrates a current distribution on a single inner parallel plate waveguide coil without an outer parallel plate waveguide coil.
Figure 17B:
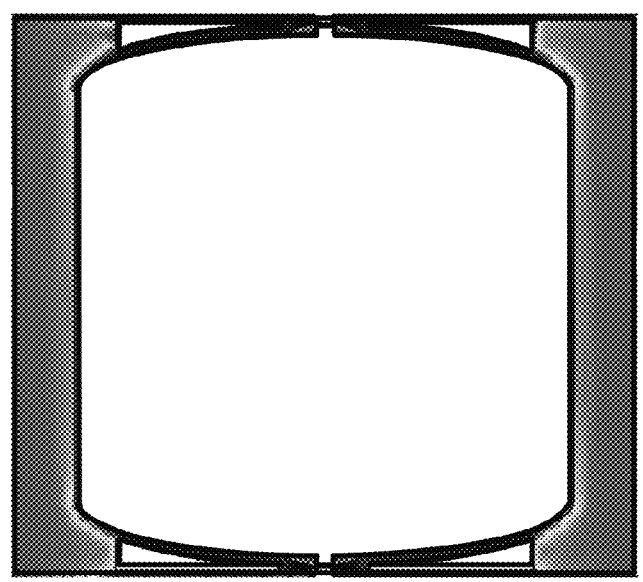
FIG. 17b illustrates a current distribution on an inner parallel plate waveguide coil with an outer parallel plate waveguide coil terminated with a matched impedance.

To further examine the effect of the cutouts have on capacitive coupling, the current distributions on a single parallel plate waveguide coil with and without the existence of another parallel plate waveguide coil were compared. With proper decoupling methods employed, no obvious change of current flows was observed between these two different scenarios as shown in FIGS. 17a and 17b which illustrate the current distribution on a single inner parallel plate waveguide coils without an outer parallel plate waveguide coil and the current distribution on an inner parallel plate waveguide coil with the outer parallel plate waveguide coil terminated with matched impedance, respectively. In order to evaluate the effectiveness of decoupling in bench-testing, the outer parallel plate waveguide coil was modified to a receiver while the inner one was still in transmitting condition. The signal strength picked-up by the outer parallel plate waveguide coil (receiver) during the transmitting of the inner parallel plate waveguide coil (transmitter) was used to measure the coupling level between two quadrature parallel plate waveguide coils.

After deciding the decoupling strategies, the input impedances of the two sets of parallel plate waveguide coils were determined. All the input impedances at four ports of the two sets of parallel plate waveguide coils are treated as identical due to the symmetry of the transmission line coils and optimized through numerical simulation to minimize the power reflected so that no standing wave will be generated within the waveguide structure. The simulated input impedances at the input ports were used in the later broadband matching network design.

With numerical simulation finished, the parallel plate waveguide coils were implemented with adhesive backed copper foil (3M, St Paul, Minn., USA) mounted onto the inner and outer surface of a fiber glass tube. The length and diameter of the inner PPW coil are 30 cm and 26.035 cm. The length and diameter of the outer parallel plate waveguide coil are 38 cm and 26.67 cm, respectively. All these dimensions were chosen as suitable for human leg imaging application. Furthermore, to diminish the eddy current introduced, several slots were also cut on the surface of both parallel plate waveguide coils and 1 nF capacitors were soldered across these slots.

Since both the parallel plate waveguides and the tapered line transformers are frequency independent, a broadband matching network which transforms impedance of the transmission line coil at all four ports to 50 ohm system impedance was designed to make the whole transmit structure functional within a wide range of frequency. The benefit of doing this is that the detuning of the transmit coil caused by the shift of the resonant frequency when different loading were applied can be avoided.

Figure 18A:
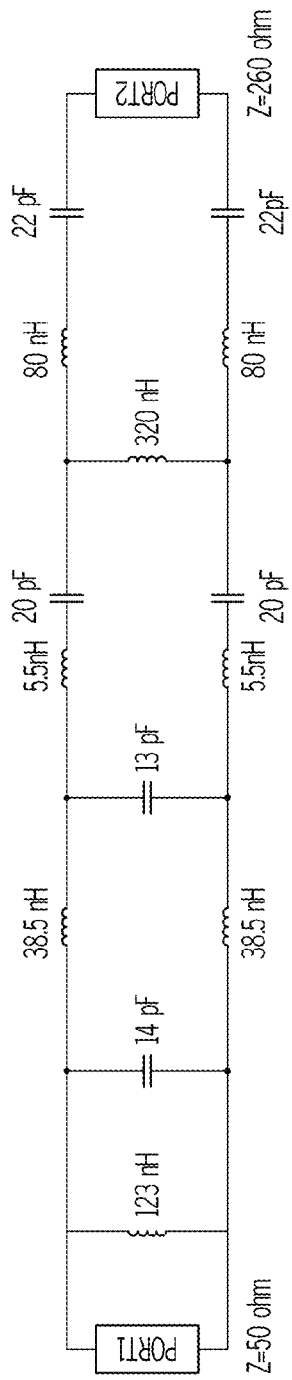
FIG. 18a is a schematic of an illustrative Chebyshev matching network of an outer parallel plate waveguide coil.
Figure 18B:
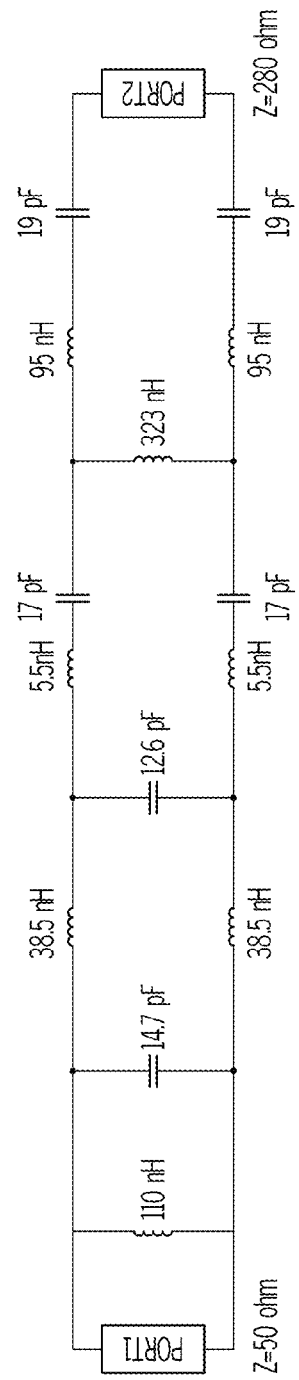
FIG. 18b is a schematic of an illustrative Chebyshev matching network of an inner parallel plate waveguide coil.

To fulfill the requirement of broadband matching, bandpass Chebyshev impedance transformers were designed and fabricated for both inner and outer transmission line coils respectively. The center frequency of the Chebyshev impedance transformer was set as 123.2 MHz and the passband edge-to-edge width was approximate 100 MHz. A 10th order impedance transformer was employed to flat the passband so that perfect impedance matching can be realized within the whole 100 MHz frequency band and the reflection loss can be reduced to the largest extent. This broadband matching network with Chebyshev frequency response was designed and optimized in ADS filter design guide (ADS 2011.10; Agilent Technologies). In fabrication, fixed high-Q ATC-100B capacitors (American Technical Ceramics, Huntington Station, N.Y.) were used to reduce the insertion loss of the matching network. In order to suppress higher-order modes of the waveguides, the matching networks were last transformed to balanced form as shown in FIGS. 18a and 18b which illustrate schematics of the Chebyshev matching network of the outer parallel plate waveguide coil and the inner parallel plate waveguide coil, respectively.

To connect the transmission line coils to the system interface, a Wilkinson power divider with center frequency of 123.2 MHz was used at the driving end of the PPW coils which splits the system input power equally in both magnitude and phase and feeds into the coils. At the terminating end, a same Wilkinson power divider was to combine the power of two terminated ports. To re-use the RF power flowing out of the PPW coils, the RF power at termination side was connected back to the driving side and combined with the system input power using a third Wilkinson power combiner. To realize the maximum transmit power usage, the phase of the re-circulate power was compensated to in-phase with the input power to prevent any power cancellation. All Wilkinson power divider and combiner circuits were implemented with ATC-100B capacitors and the 164-series and 165-series tunable inductors (Coilcraft, Cary, Ill.).

A de-tunable four channel receive array was designed and fabricated to increase local SNR and prove the feasibility of using the quadrature parallel plate waveguide coils for homogeneous transmit field generation. Since the transmission line coils were built on a cylindrical tune, to realize an optimal SNR and field coverage, a conformal structure was also employed for the receive array so that it could be closely fit to both PPW coils and scanning subjects. The receive array was located about 1 cm away from the transmit coil and about 2 cm from the phantom.

To eliminate the mutual coupling between all the receive elements, two decoupling strategies were employed for the receive array. For the head-to-head two elements, capacitance decoupling was used. Decoupling was realized through adjusting the capacitor values on the shared edge of the two receive elements. For neighboring two elements, decoupling was accomplished by changing the size of the overlap area.

All of the decoupling steps described above were performed firstly in numerical simulation to provide a reasonable starting point for later receive array fabrication. After finishing simulating the tuning and decoupling of all the receive elements, the simulation model was directly translated to a coil housing design by the FEKO and fabricated by 3D printing. AWG #16 copper wire was used to build the receive array, and total 9 fixed value capacitors (American Technical Ceramics Co., Ltd.) were soldered onto each receive element to tune the receive element to 123.2 MHz. To detune the receive array during transmitting, a PIN diode (MA4P7470-1072T, Macom, Lowell, Mass.) was connected in shunt of the matching board of each receive element.

The quadrature parallel plate waveguide coils and its local receive array were tested on a Siemens verio open-bore 3T scanner (Siemens Healthcare, Erlangen, Germany). To connect the parallel plate waveguide PPW coils and receive array to Siemens 3T scanner, two interface boxes were used. The transmit interface box provides two quadrature output ports (0° and 90°) which the transmit coils can be connected directly to. In the four-channel receive only interface box, the DC control signal is combined with RF signal via bias tee to control the receive elements for active detuning. All the bench measurements were performed on a calibrated network analyzer (E5061A; Agilent Technologies Inc., CA, USA).

The transmit coils were tested in 3T scanner for both linear mode and quadrature mode to prove the improvement in transmits efficiency. In all scanning experiments, same head phantom was used to mimic the loading of the human head and the conformal receive array was positioned at the bottom of the head phantom and kept about 2 cm away from it. During the linear transmit mode experiments, the outer PPW coil was disconnected and the inner one was remained in working condition. The two quadrature output ports of the transmit interface box were combined using a hybrid coupler whose working frequency is 123.2 MHz, and then the output of the coupler was connected to the inner PPW coil for excitation. The normalized signal intensity at the center area of the head phantom was measured for each RF transmit voltage. The gradient echo sequence with following parameters was used: FOV=320, Resolution=256*256, Voxel size=1.3*1.3*5.5 mm, TR=50 ms, TE=3.46 ms, Average=1, Nominal flip angle=10 degree. Then, the same GRE sequence and experiment procedure were repeated for the quadrature transmit structure with both inner and outer PPW coils in transmitting and the scanning results were compared with that of the linear structure.

In addition to phantom testing, scanning was also performed on a human body for imaging. Images were taken using a spin echo sequence with the following parameters: FOV=200*200, Resolution=256*256, Voxel size=0.8*0.8*3 mm, TR=50 ms, TE=3.78 ms, Average=1, RF Voltage=100 V and nominal flip angle=10 degree on calf muscle of a healthy volunteer.

Through numerical simulation, the impedances at the feeding points for inner and outer parallel plate waveguide coils were determined as 260 ohm and 280 ohm. When terminated with these impedances, the simulated reflection coefficients for both PPW coils were below −25 dB at 123.2 MHz. To match the parallel plate waveguide coils to the system 50 ohm characteristic impedance, the broadband Chebyshev matching circuits illustrated in FIGS. 18a and 18b referenced above were employed.

Figure 19A:
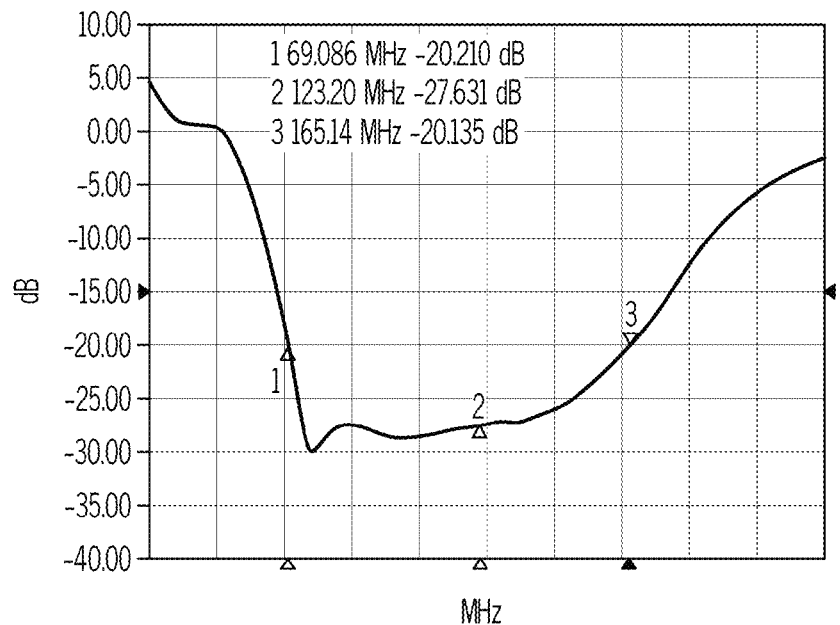
FIG. 19a illustrates a reflection coefficient measured for an outer parallel plate waveguide coil's matching network.
Figure 19B:
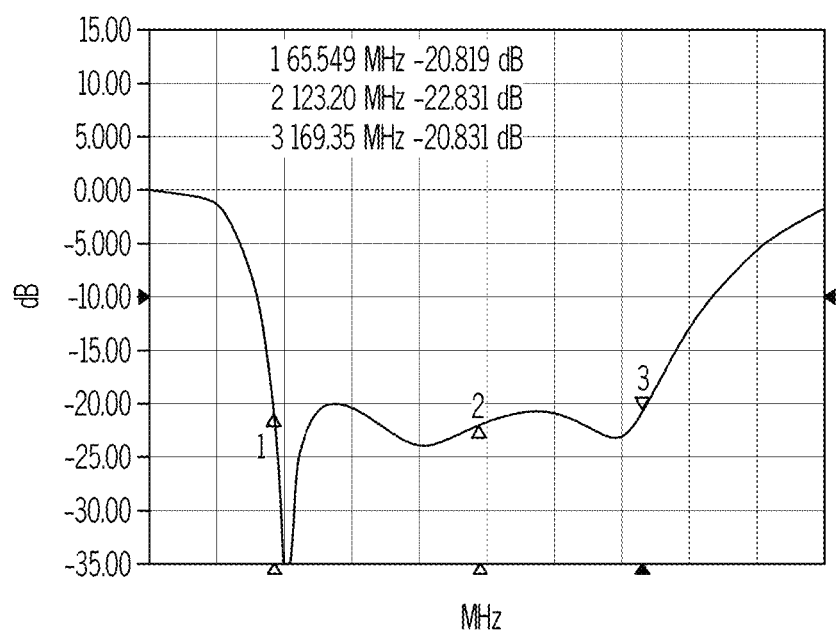
FIG. 19b illustrates a reflection coefficient measured for an inner parallel plate waveguide coil's matching network.

FIGS. 18a and 18b show the schematic circuits and component values of the matching networks. The measured reflection coefficients were below −20 dB over an approximate 100 MHz frequency range as shown in FIGS. 19a and 19b which illustrate the reflection coefficient measures for the outer coil's matching network and the inner coil's matching network, respectively. Since this combination of inner and outer coils was designed for 3T testing purpose, conventional narrowband 1:1 Wilkinson power dividers working at 123.2 MHz were used as power splitters/and combiners. The power dividing ratio was −3.2 dB for both two output ports and the phase difference was −3°.

Figure 20A:
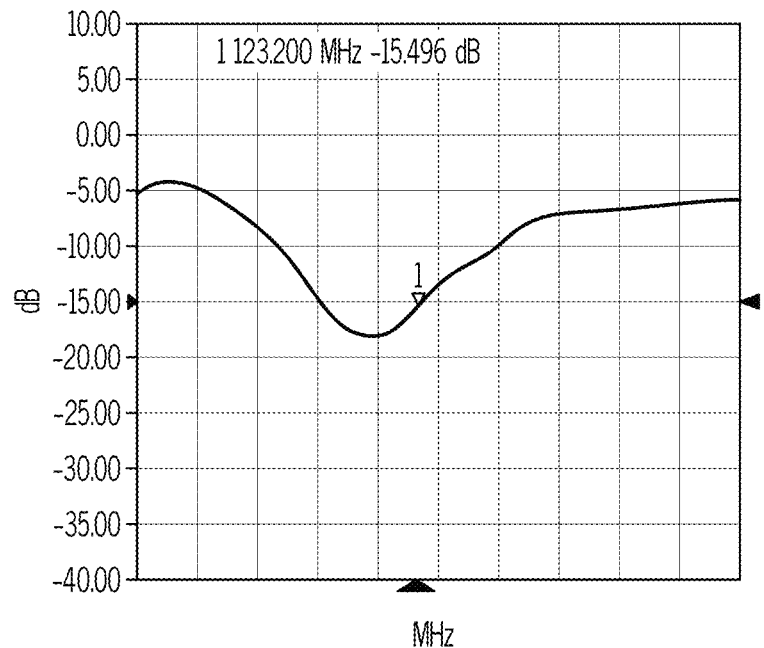
FIGS. 20a and 20b illustrate bench measured reflection coefficients of an inner parallel plate waveguide coil without a phantom and with a phantom, respectively.
Figure 20B:
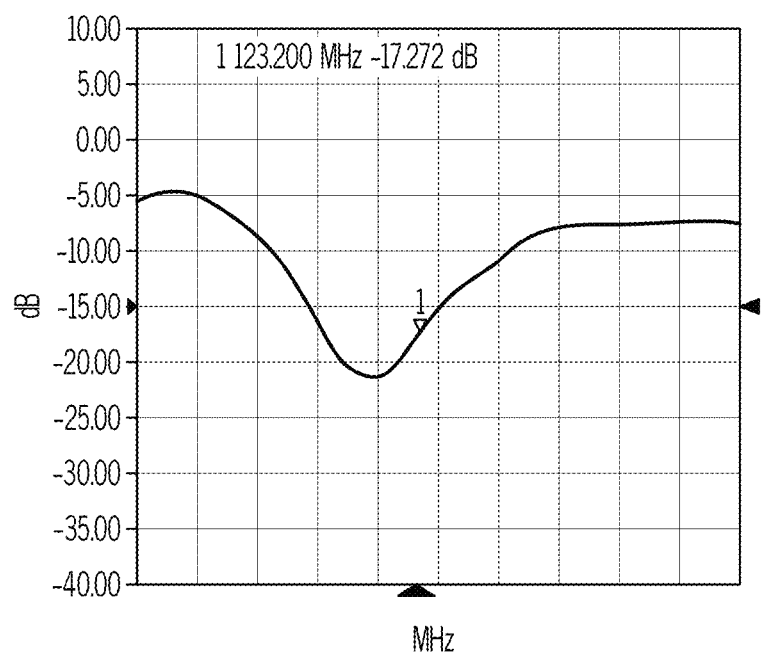
Figure 20C:
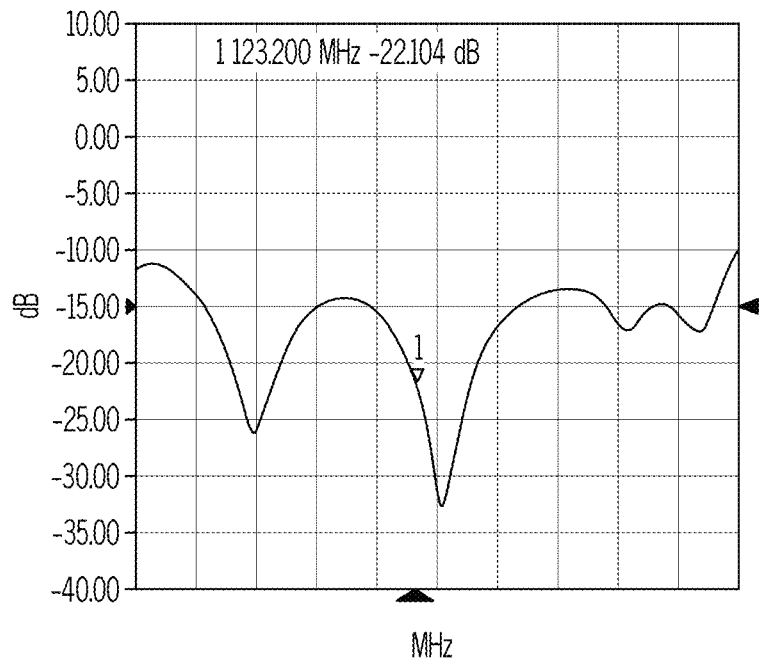
FIGS. 20c and 20d illustrate bench measured reflection coefficients of an outer parallel plate waveguide coil without a phantom and with a phantom, respectively.
Figure 20D:
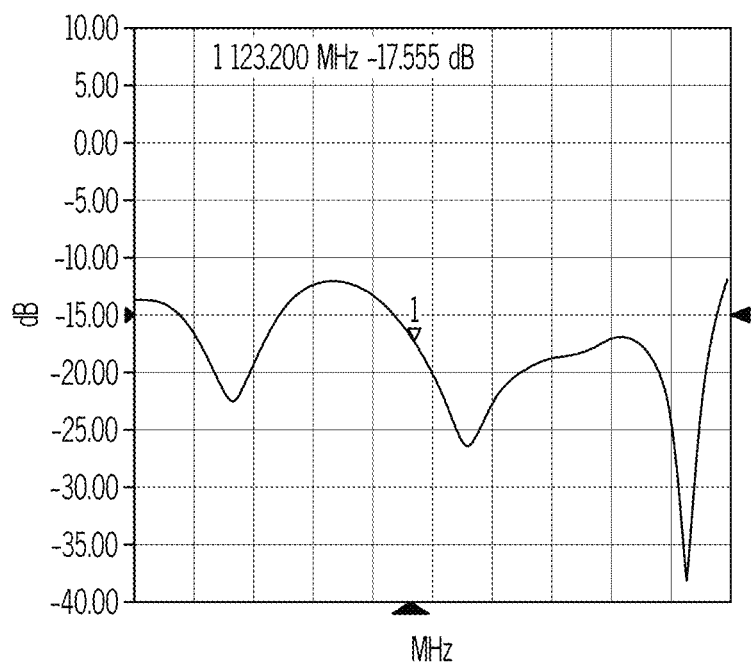

A head phantom filled with saline water of $\epsilon$=56, $\sigma$=0.657 was used as the load in the bench testing process of both PPW coils and receive array to mimic the loading of human head. The reflection coefficient was measured for both inner and outer parallel plate waveguide coils. With the existence of the loading, the measured S11 for the inner coil and the outer coil were below −17 dB as shown in FIGS. 20b and 20d, respectively. This means only about 2 percent of the transmit power will be reflected back to the system. Under the circumstance of totally no loading inside the coil, the S11 measured for the inner coil and the outer coil were still below −15 dB, as shown in FIGS. 20a and 20c, respectively. The frequency span for the measurement of reflection coefficient was 60 MHz and the measured reflection coefficients included the parallel plate waveguide structure, Chebyshev matching networks and the Wilkinson splitter/combiner.

As mentioned above, the coupling between two parallel plate waveguide coils were measured by making one of them transmit and the other receive. The measured S21 was below −28 dB at 123.2 MHz.

Figure 21A:
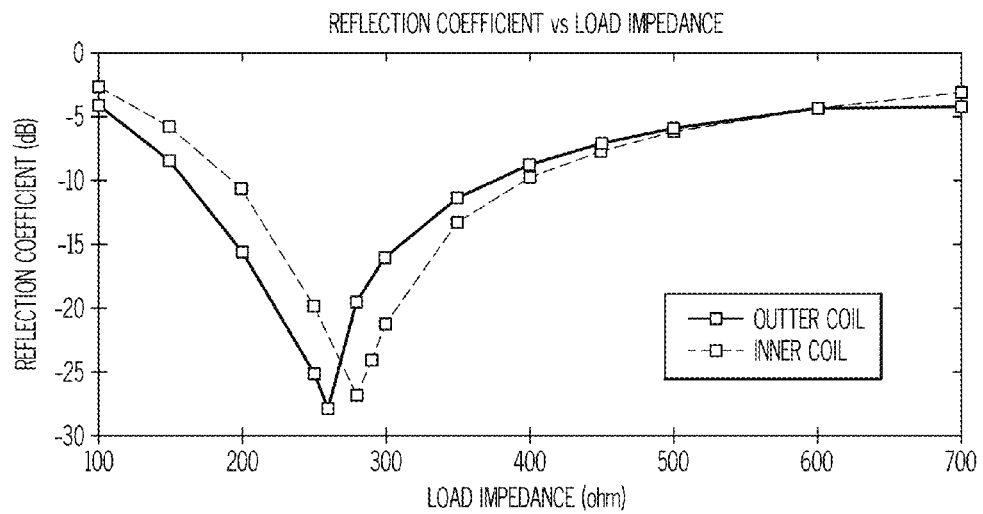
FIG. 21a illustrates an optimization of a reflection coefficient versus a transmit coil's load impedance for the parallel plate waveguide coils according to the second embodiment.
Figure 21B:
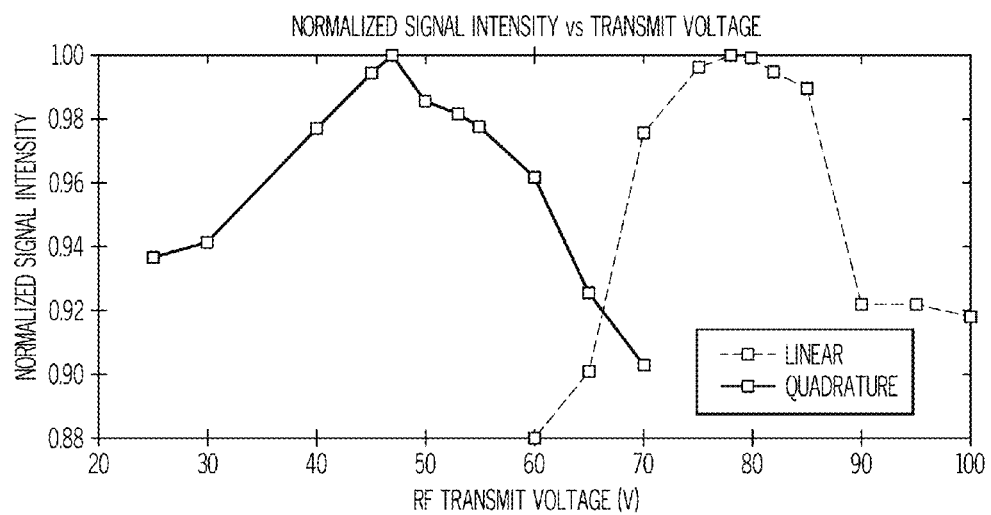
FIG. 21b illustrates a normalized signal intensity versus a transmit voltage for linear and quadrature structures.

The optimized impedances of the outer and inner parallel plate waveguide coils are shown in FIG. 21a which illustrates the reflection coefficient versus the transmit coils' load impedances. The measured proton transmit efficiency is shown in FIG. 21b which illustrates the normalized signal intensity versus the transmit voltage for linear and quadrature structures. The optimal transmit voltage was found as 78 V and 47V for linear and quadrature structure respectively. An approximate 40 percent improvement in transmit efficiency was observed.

Figure 22A:
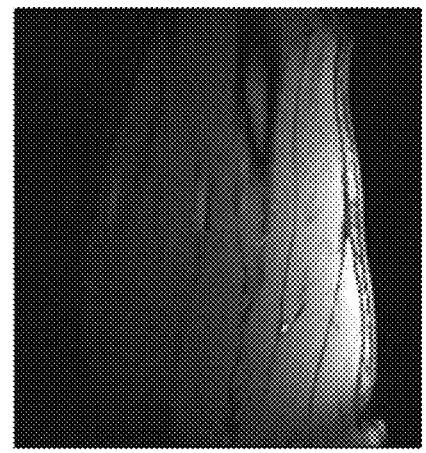
FIGS. 22a and 22b illustrate spin echo images of a calf muscle of a sagittal plane and a transversal plane, respectively.
Figure 22B:
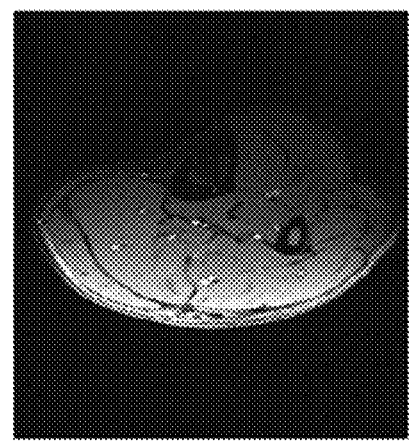

The spin echo images of the calf muscle of sagittal and transversal planes are shown in FIGS. 22a and 22b, respectively. The brighter areas in the images are related to the profile of the receive array.

According to this embodiment, the benefits of a parallel plate waveguide in an MRI scanner are extended by using two sets of parallel plate waveguides placed perpendicularly with respect to each other. The use of two sets of parallel plate waveguides allows for MRI applications for larger volume transmissions with improved transmit efficiency.

While the invention has been described with reference to preferred and example embodiments, it will be understood by those skilled in the art that a number of modifications, additions and deletions are within the scope of the invention, as defined by the following claims.

What is claimed is:

1. A device, comprising:
   a waveguide forming a volume coil for containing a target to be imaged, wherein the waveguide includes:
      a first conducting plate arranged on a first side of the waveguide; and
      a second conducting plate arranged on a second side of the waveguide, such that excitation of the first conducting plate and the second conducting plate creates a transverse electromagnetic field between the first conducting plate and the second conducting plate which causes the target contained within the volume coil, between the first conducting plate and the second conducting plate, to emit radio frequency signals used for producing an image of the target;
      wherein the waveguide is configured to act as a transmission line resonator to facilitate signal reception, and wherein a length of the waveguide transmission is equal to an odd number of wavelengths at a resonant frequency for signal reception.

2. The device of claim 1, wherein the radio frequency signals emitted are used for magnetic resonant imaging.

3. The device of claim 1, wherein the radio frequency signals emitted are used for spectroscopy.

4. The device of claim 1, wherein a surface of the first conducting plate and a surface of the second conducting plate are continuous.

5. The device of claim 1, wherein a surface of the first conducting plate and a surface of the second conducting plate are not continuous but form a continuous radio frequency path.

6. The device of claim 1, wherein the first conducting plate is parallel to the second conducting plate.

7. The device of claim 1, wherein the waveguide is a split conical transmission line with a front end that is open and a back end that is open.

8. The device of claim 1, wherein the waveguide is configured to be connected to coaxial cables, and the device further comprises an impedance matching network configured to transform an impedance of the waveguide to an impedance of the coaxial cables.

9. The device of claim 1, further comprising a power divider configured to split a radio frequency input into a first input and a second input to the waveguide.

10. The device of claim 1, further comprising a power combiner configured to merge a first output and a second output of the waveguide into a single radio frequency output.

11. The device of claim 10, further comprising a recirculation termination power combiner configured to feed the merged first and second outputs of the waveguide back to and in-phase with an input of the waveguide.

12. The device of claim 11, further comprising a phase shifter to adjust a phase of the merged first and second outputs to be in-phase with the input of the waveguide.

13. The device of claim 1, wherein one end of the waveguide is open, and the other end is connected to a high-impedance pre-amplifier to facilitate sensing of an induced voltage.

14. A device, comprising:
    a first waveguide and a second waveguide forming a volume coil for containing a target to be imaged;
    a first conducting plate arranged on a first side of the first waveguide;
    a second conducting plate arranged on a second side of the first waveguide such that excitation of the first conducting plate and the second conducting plate creates a first transverse electromagnetic field between the first conducting plate and the second conducting plate;
    a third conducting plate arranged on a first side of the second waveguide; and
    a fourth conducting plate arranged on a second side of the second waveguide, such that excitation of the third conducting plate and the fourth conducting plate creates a second transverse electromagnetic field between the third conducting plate and the fourth conducting plate,
    wherein the first and second transverse electromagnetic fields cause the target contained within the volume coil, between the first conducting plate and the second conducting plate, to emit radio frequency signals used for producing an image of the target.

15. The device of claim 14, wherein the second waveguide is orthogonal to the first waveguide.

16. The device of claim 14, wherein the first conducting plate, the second conducting plate, the third conducting plate, and the fourth conducting plate are driven in quadrature for circular excitation that creates the transverse electromagnetic fields.

17. The device of claim 14, wherein the second waveguide is arranged outside of and surrounds at least a portion of the first waveguide.

18. The device of claim 14, wherein the first waveguide and the second waveguide make up a split conical transmission line with a front end that is open and a back end that is open.

* * * * *